United States Patent
Qin et al.

(10) Patent No.: US 11,515,491 B2
(45) Date of Patent: Nov. 29, 2022

(54) PEROVSKITE FILM, METHOD FOR PRODUCING THE SAME, LIGHT-EMITTING DEVICE AND SOLAR CELL

(71) Applicant: KYUSHU UNIVERSITY, NATIONAL UNIVERSITY CORPORATION, Fukuoka (JP)

(72) Inventors: Chuanjiang Qin, Fukuoka (JP); Toshinori Matsushima, Fukuoka (JP); Chihaya Adachi, Fukuoka (JP)

(73) Assignee: KYUSHU UNIVERSITY, NATIONAL UNIVERSITY CORPORATION, Fukuoka (JP)

( * ) Notice: Subject to any disclaimer, the term of this patent is extended or adjusted under 35 U.S.C. 154(b) by 292 days.

(21) Appl. No.: 16/613,894

(22) PCT Filed: May 15, 2018

(86) PCT No.: PCT/JP2018/019420
§ 371 (c)(1),
(2) Date: Nov. 15, 2019

(87) PCT Pub. No.: WO2018/212356
PCT Pub. Date: Nov. 22, 2018

(65) Prior Publication Data
US 2020/0203633 A1 Jun. 25, 2020

(30) Foreign Application Priority Data
May 15, 2017 (JP) .............................. JP2017-096690

(51) Int. Cl.
| | | |
|---|---|---|
| H01L 51/00 | (2006.01) | |
| C07F 7/24 | (2006.01) | |
| C09K 11/06 | (2006.01) | |
| H01G 9/20 | (2006.01) | |
| H01L 51/50 | (2006.01) | |
| C09K 11/66 | (2006.01) | |
| H01L 33/02 | (2010.01) | |
| H01L 27/30 | (2006.01) | |

(52) U.S. Cl.
CPC ............ H01L 51/0077 (2013.01); C07F 7/24 (2013.01); C09K 11/06 (2013.01); C09K 11/664 (2013.01); C09K 11/665 (2013.01); H01G 9/2009 (2013.01); H01L 27/301 (2013.01); H01L 33/02 (2013.01); H01L 51/50 (2013.01); C09K 2211/10 (2013.01)

(58) Field of Classification Search
CPC ....... C07F 7/27; C09K 11/664; C09K 11/665; H01L 33/02; H01L 27/301; H01L 51/50
See application file for complete search history.

(56) References Cited

U.S. PATENT DOCUMENTS

| | | | | |
|---|---|---|---|---|
| 10,804,412 | B2 * | 10/2020 | Lee | .............. H01L 51/4226 |
| 2017/0213967 | A1 * | 7/2017 | Chen | .............. H01L 51/4246 |
| 2018/0105543 | A1 * | 4/2018 | Zhu | .................. C07F 7/22 |
| 2020/0277313 | A1 * | 9/2020 | Choi | ................ C07F 7/24 |

FOREIGN PATENT DOCUMENTS

| | | | |
|---|---|---|---|
| CN | 106025087 A | | 10/2016 |
| WO | WO 2016/198889 | * | 12/2016 |
| WO | WO 2017/090861 | * | 6/2017 |
| WO | 2018-015831 A1 | | 1/2018 |
| WO | 2018-026326 A1 | | 2/2018 |

OTHER PUBLICATIONS

Zhang et al, "High Efficiency Rubidium-Incorporated Perovskite Solar Cells by Gas Quenching", ACS Energy Letters, 2017, 2, pp. 438-444, Jan. 23, 2017.*
Jeon et al, "Compositional engineering of perovskite materials for high-preformance solar cells", Nature, vol. 517, Jan. 22, 2015, pp. 476-479.*
Ahn. N et al. Trapped charge-driven degradation of perovskite solar cells. Nature Commun 7,13422, 1-9, Nov. 10, 2016.*
International Preliminary Report on Patentability for corresponding PCT International Application No. PCT/JP2018/019420, dated Aug. 21, 2018.
International Search Report and Search Opinion for corresponding International appl. No. PCT/JP2018/019420, dated Aug. 21, 2018.
Park N.-G., Gratzel M., Miyasaka T., Zhu K. & Emery K. Towards stable and commercially available perovskite solar cells. Nature Energy 1, 16152 (2016).
Zhao, Y. & Zhu, K. Organic-inorganic hybrid lead halide perovskites for optoelectronic and electronic applications. Chem. Soc. Rev. 45, 655-689 (2016).
Leijtens, T., Eperon, G. E., Noel, N. K., Habisreutinger, S. N., Petrozza, A. & Snaith, H. J. Stability of metal halide perovskite solar cells. Adv. Energy Mater. 5, 1500963 (2015).
Berhe, T. A. et al. Organometal halide perovskite solar cells: degradation and stability. Energy Environ. Sci. 9, 323-356 (2016).
Yang, J. & Kelley, T. L. Decomposition and cell failure mechanisms in lead halide perovskite solar cells, Inorg. Chem. 56, 92-101 (2017).
Niu, G., Guo, X. & Wang, L. Review of recent progress in chemical stability of perovskite solar cells. J. Mater. Chem. A 3, 8970-8980 (2015).
Leijtens, T. et al. Overcoming ultraviolet light instability of sensitized TiO2 with meso-superstructured organometal tri-halide perovskite solar cells. Nature Commun. 4, 2885 (2014).
Bryant, D. et al. Light and oxygen induced degradation limits the operational stability of methylammonium lead triiodide perovskite solar cells. Energy Environ. Sci. 9, 1655-1660 (2016).
Divitini, G. et al. In situ observation of heat-induced degradation of perovskite solar cells. Nature Energy 1, 15012 (2016).

(Continued)

Primary Examiner — C Melissa Koslow
(74) Attorney, Agent, or Firm — Browdy and Neimark, PLLC

(57) ABSTRACT

Stable perovskite films having substantially-no phase transition within a predetermined temperature range are disclosed. In the films, formation of carrier traps is suppressed. Thermally stable perovskite solar cells and light-emitting devices using the films are also disclosed.

6 Claims, 16 Drawing Sheets

(56) References Cited

OTHER PUBLICATIONS

Kim, J., Lee, S.-H., Lee, J. & Hong, K.-H. The role of intrinsic defects in methylammonium lead iodide perovskite. J. Phys. Chem. Lett. 5, 1312-1317 (2014).
Baumann, A. et al. Identification of trap states in perovskite solar cells. J. Phys. Chem. Lett. 137, 2350-2354 (2015).
Qin, C. et al. Degradation mechanisms of solution-processed planar perovskite solar cells: thermally stimulated current measurement for analysis of carrier traps. Adv. Mater. 28, 466-471 (2016).
Yin, W.J., Shi, T., & Yan, Y. Unusual defect physics in CH3NH3PbI3 perovskite solar cell absorber. Appl. Phys. Lett. 104, 063903 (2014).
Stevart, R. J. et al. Molecular origins of defects in organohalide perovskites and their influence on charge carrier dynamics, J. Phys. Chem. C 120, 12392-12402 (2016).
Qin, C. et al. Multifunctional benzoquinone additive for efficient and stable planar perovskite solar cells. Adv. Mater. 29, 1603808 (2017).
Biakie, T. et al. Synthesis and crystal chemistry of the hybrid perovskite (CH3NH3)PbI3 for solid-state sensitized solar cell applications. J. Mater. Chem. A 1, 5628-5641. (2013).
Roesch, R. et al. Procedures and practices for evaluating thin-film solar cell stability. Adv. Energy Mater. 5, 1501407 (2015).
Conings, B. et al. Intrinsic thermal instability of methylammonium lead trihalide perovskite. Adv. Energy Mater. 5, 1500477 (2015).
McMeekin, D. P. et al. A mixed-cation lead mixed-halide perovskite absorber for tandem solar cells. Science 351, 151-155 (2016).
Rosales, B. A. et al. Persistent dopants and phase segregation in organolead mixed-halide perovskites. Chem. Mater. 28, 6848-6859 (2016).
Stoumpos, C. C., Malliakas, C. D. & Kanatzidis, M. G. Semiconducting tin and lead iodide perovskites with organic cations: phase transitions, high mobilities, and near-infrared photoluminescent properties. Inorg. Chem. 52, 9019-9038 (2013).
Juarez-Perez, E. J. et al. Thermal degradation of CH3NH3PbI3 perovskite into NH3 and CH3I gases observed by coupled thermogravimetry-mass spectrometry analysis. Energy Environ. Sci. 9, 3406-3410 (2016).
Ahn, N. et al. Trapped charge-driven degradation of perovskite solar cells. Nature Commun. 7, 13422 (2016).
Kawano, K. & Adachi, C. Evaluating carrier accumulation in degraded bulk heterojunction organic solar cells by a thermally stimulated current technique. Adv. Func. Mater. 19, 3934 3940 (2009).
Wu, X. et al. Trap states in lead iodide perovskites. J. Am. Chem. Soc. 137, 2089-2096 (2015).
Office Action dated Jan. 12, 2022 issued in the corresponding Taiwanese patent application No. 107116440 with its English Translation.
Ahn et al., Trapped charge-driven degradation of perovskite solar cells, Nature Communications 7:13422; DOI: 10.1038/ncomms13422, pp. 1-9, Nov. 10, 2016.
Jeon et al., Compositional engineering of perovskite materials for high-performance solar cells, Nature, 517:476-480 (Jan. 22, 2015) Macmillan Publishers Limited.
Zhang et al., High-efficiency rubidium-incorporated perovskite solar cells by gas quenching, ACS Energy Letters, 2:438-444 (Jan. 23, 2017) American Chemical Society.
Saliba et al., Incorporation of rubidium cations into perovskite solar cells improves photovoltaic performance, Science 354 (6309):206-209 (published online Sep. 29, 2016) with published Supplementary Materials.
Goldschmidt, V. M. Laws of crystal chemistry. Naturwissenschaften 14:477-485 (1926).
Office Action dated Sep. 2, 2022 issued in the corresponding Taiwan patent application No. 107116440 with its English Translation.

\* cited by examiner

PEROVSKITE FILM, METHOD FOR PRODUCING THE SAME, LIGHT-EMITTING DEVICE AND SOLAR CELL

TECHNICAL FIELD

The present invention relates to a perovskite film, a method for producing it, a light-emitting device and a solar cell.

BACKGROUND ART

Organic-inorganic halide perovskite solar cells (PSCs) are promising for next-generation clean energy because they can achieve high power conversion efficiencies ($\eta$) and be fabricated with simple and low-cost methods (Non-Patent Literature 1 and 2: Park et al. 2016; Zhao et al. 2016). Although a certified $\eta$ of 22.1% has been achieved through state-of-the-art device engineering, the device stability is still not sufficient for widespread commercialization (Non-Patent Literature 3, 4 and 5: Leijtens et al. 2015; Berhe et al. 2016; Yang et al. 2017). Extrinsic factors such as moisture, oxygen, UV light, and temperature are known to limit the stability of perovskite materials and PSCs made from them, (Non-Patent Literature 5, 6, 7, 8 and 9: Yang et al. 2017; Niu et al. 2015; Leijtens et al. 2014; Bryant et al. 2016; Divitini et al. 2016) but intrinsic degradation mechanisms must still be further clarified to find new solutions for fabricating PSCs with excellent long-term stability.

Among the known intrinsic factors, carrier traps and defects that degrade the device performance and lifetime have already been observed in PSCs with methylammonium lead triiodide ($CH_3NH_3PbI_3$) perovskite absorbers (Non-Patent Literature 10, 11 and 12 Kim et al. 2014; Baumann et al. 2015; Qin et al. 2016). Several possible origins of defects have been proposed based on different experimental techniques and theoretical simulations (Non-Patent Literature 13, 14 and 15: Yin et al. 2014; Stevart et al. 2016; Qin et al. 2017). Stevart et al. reported that the chemical equilibria among iodoplumbate species may play a role in the creation of charge recombination centers (Non-Patent Literature 14: Stevart et al. 2016). By decreasing the concentration of the lead ion species used during perovskite film formation, the concentration of defect precursor could be reduced in solutions. In our work, we found that hole traps are easily generated after exposure of $CH_3NH_3PbI_3$ perovskite films to the moisture in air, which accelerates the degradation of PSCs under continuous light irradiation (Non-Patent Literature 12: Qin et al. 2016). Through systematic experimental studies, we showed that Frenkel defects are detrimental to the stability of PSCs and that metallic lead is a possible intrinsic origin of carrier traps (Non-Patent Literature 15: Qin et al. 2917). By virtue of the weak reduction properties of a benzoquinone additive, we were able to suppress the formation of metallic lead and effectively extend the lifetime of the PSCs.

Another important consideration is that phase transitions exist in most perovskite materials. For example, the widely used $CH_3NH_3PbI_3$ has two phase transitions: one is the phase transition between the octahedral structure and the tetragonal structure at around 161 K and the other is the phase transition between the tetragonal structure and the cubic structure at around 328 K (Non-Patent Literature 16: Biakie et al. 2013). Based on the analysis of thermally stimulated current (TSC), the phase transition at around 161 K has been shown to induce the formation of carrier traps (Non-Patent Literature 11, 12 and 15: Baumann et al. 2015; Qin et al. 2016; Qin et al. 2017). Since this phase transition temperature is much lower than the operating temperature of PSCs in naturally occurring terrestrial environments, the influence of the low-temperature phase transition on device performance should be negligible. However, the high-temperature phase transition is at a temperature just slightly higher than room temperature (Non-Patent Literature 17: Roesch et al. 2015). Therefore, how the high-temperature phase transition affects the device performance and stability must be understood to develop PSCs that can pass strict lifetime tests under high temperatures up to 85° C. for future practical applications.

NON-PATENT LITERATURES

Non-Patent Literature 1: Park N.-G., Gratzel M., Miyasaka T., Zhu K. & Emery K. Towards stable and commercially available perovskite solar cells. *Nature Energy* 1, 16152 (2016).

Non-Patent Literature 2: Zhao, Y. & Zhu, K. Organic-inorganic hybrid lead halide perovskites for optoelectronic and electronic applications. *Chem. Soc. Rev.* 45, 655-689 (2016).

Non-Patent Literature 3: Leijtens, T., Eperon, G. E., Noel, N. K., Habisreutinger, S. N., Petrozza, A. & Snaith, H. J. Stability of metal halide perovskite solar cells. *Adv. Energy Mater.* 5, 1500963 (2015).

Non-Patent Literature 4: Berhe, T. A. et al. Organometal halide perovskite solar cells: degradation and stability. *Energy Environ. Sci.* 9, 323-356 (2016).

Non-Patent Literature 5: Yang, J. & Kelley, T. L. Decomposition and cell failure mechanisms in lead halide perovskite solar cells, *Inorg. Chem.* 56, 92-101 (2017).

Non-Patent Literature 6: Niu, G., Guo, X. & Wang, L. Review of recent progress in chemical stability of perovskite solar cells. J. Mater. Chem. A 3, 8970-8980 (2015).

Non-Patent Literature 7: Leijtens, T. et al. Overcoming ultraviolet light instability of sensitized $TiO_2$ with meso-superstructured organometal tri-halide perovskite solar cells. *Nature Commun.* 4, 2885 (2014).

Non-Patent Literature 8: Bryant, D. et al. Light and oxygen induced degradation limits the operational stability of methylammonium lead triiodide perovskite solar cells. *Energy Environ. Sci.* 9, 1655-1660 (2016).

Non-Patent Literature 9: Divitini, G. et al. In situ observation of heat-induced degradation of perovskite solar cells. *Nature Energy* 1, 15012 (2016).

Non-Patent Literature 10: Kim, J., Lee, S.-H., Lee, J. & Hong, K.-H. The role of intrinsic defects in methylammonium lead iodide perovskite. *J. Phys. Chem. Lett.* 5, 1312-1317 (2014).

Non-Patent Literature 11: Baumann, A. et al. Identification of trap states in perovskite solar cells. *J. Phys. Chem. Lett.* 137, 2350-2354 (2015).

Non-Patent Literature 12: Qin, C. et al. Degradation mechanisms of solution-processed planar perovskite solar cells: thermally stimulated current measurement for analysis of carrier traps. *Adv. Mater.* 28, 466-471 (2016).

Non-Patent Literature 13: Yin, W. J., Shi, T., & Yan, Y. Unusual defect physics in $CH_3NH_3PbI_3$ perovskite solar cell absorber. *Appl. Phys. Lett.* 104, 063903 (2014).

Non-Patent Literature 14: Stevart, R. J. et al. Molecular origins of defects in organohalide perovskites and their influence on charge carrier dynamics, *J. Phys. Chem. C* 120, 12392-12402 (2016).

Non-Patent Literature 15: Qin, C. et al. Multifunctional benzoquinone additive for efficient and stable planar perovskite solar cells. *Adv. Mater.* 29, 1603808 (2017).

Non-Patent Literature 16: Biakie, T. et al. Synthesis and crystal chemistry of the hybrid perovskite $(CH_3NH_3)PbI_3$ for solid-state sensitized solar cell applications. *J. Mater. Chem. A* 1, 5628-5641. (2013).

Non-Patent Literature 17: Roesch, R. et al. Procedures and practices for evaluating thin-film solar cell stability. *Adv. Energy Mater.* 5, 1501407 (2015).

Non-Patent Literature 18: Conings, B. et al. Intrinsic thermal instability of methylammonium lead trihalide perovskite. *Adv. Energy Mater.* 5, 1500477 (2015).

Non-Patent Literature 19: Jeon, N. J. et al. Compositional engineering of perovskite materials for high-performance solar cells. *Nature* 517, 476-480 (2015).

Non-Patent Literature 20: McMeekin, D. P. et al. A mixed-cation lead mixed-halide perovskite absorber for tandem solar cells. *Science* 351, 151-155 (2016).

Non-Patent Literature 21: Saliba, M. et al. Incorporation of rubidium cations into perovskite solar cells improves photovoltaic performance, *Science* 354, 206-209 (2016).

Non-Patent Literature 22: Rosales, B. A. et al. Persistent dopants and phase segregation in organolead mixed-halide perovskites. *Chem. Mater.* 28, 6848-6859 (2016).

Non-Patent Literature 23: Stoumpos, C. C., Malliakas, C. D. & Kanatzidis, M. G. Semiconducting tin and lead iodide perovskites with organic cations: phase transitions, high mobilities, and near-infrared photoluminescent properties. *Inorg. Chem.* 52, 9019-9038 (2013).

Non-Patent Literature 24: Juarez-Perez, E. J. et al. Thermal degradation of $CH_3NH_3PbI_3$ perovskite into $NH_3$ and $CH_3I$ gases observed by coupled thermogravimetry—mass spectrometry analysis. *Energy Environ. Sci.* 9, 3406-3410 (2016).

Non-Patent Literature 25: Ahn, N. et al. Trapped charge-driven degradation of perovskite solar cells. *Nature Commun.* 7, 13422 (2016).

Non-Patent Literature 26: Kawano, K. & Adachi, C. Evaluating carrier accumulation in degraded bulk heterojunction organic solar cells by a thermally stimulated current technique. *Adv. Func. Mater.* 19, 3934-3940 (2009).

Non-Patent Literature 27: Wu, X. et al. Trap states in lead iodide perovskites. *J. Am. Chem. Soc.* 137, 2089-2096 (2015).

Non-Patent Literature 28: Goldschmidt, V. M. Laws of crystal chemistry. *Naturwissenschaften* 14, 477-485 (1926)

Non-Patent Literature 29: Zhang, M. et al. High-efficiency rubidium-incorporated perovskite solar cells by gas quenching. *ACS Energy Lett.* 2, 438-444 (2017).

SUMMARY OF INVENTION

Although a power conversion efficiency of over 20% has been achieved in $CH_3NH_3PbI_3$-based perovskite solar cells, low thermal stability associated with the presence of a phase transition between the tetragonal structure and the cubic structure near room temperature is a major issue that must be overcome for future practical applications. Here, the influence of the phase transition on the thermal stability of perovskite solar cells was investigated in detail by comparing five kinds of perovskite films with different compositions of halogen atoms, rubidium, and organic components. Thermally stimulated current measurements revealed that a large number of carrier traps are generated in solar cells with the perovskite $CH_3NH_3PbI_3$ as a light absorber after operation at 85° C., which is higher than the phase transition temperature. These carrier traps are detrimental to the thermal stability. The perovskite alloys do not have this phase transition, resulting in effectively suppressed formation of carrier traps. By introducing rubidium ions into the perovskite, the device performance and thermal stability of the solar cells were further improved because of reduced non-radiative recombination and suppressed carrier trap formation, respectively, during frequent cycling of device temperature. Perovskite solar cells with improved thermal stability under standard thermal cycling test were realized.

The present application discloses the following inventions:

(1) A perovskite film having substantially-no phase transition within the temperature range of from 0° C. to 100° C.

(2) The perovskite film according to (1), wherein the phase transition is a change of crystal structure.

(3) The perovskite film according to (2), wherein the phase transition is a phase transition between a tetragonal structure and a cubic structure.

(4) The perovskite film according to (2), wherein the phase transition is a phase transition between an octahedral structure and a tetragonal structure.

(5) A perovskite film wherein formation of carrier traps is suppressed within the temperature range of from 0° C. to 100° C.

(6) The perovskite film according to (5), wherein formation of carrier traps is suppressed within the temperature range of from 10° C. to 100° C.

(7) The perovskite according to (5) or (6), wherein formation of carrier traps is suppressed more than a $CH_3NH_3PbI_3$ film.

(8) The perovskite film according to any one of (1) to (7), comprising a perovskite compound represented by the following Formula (1), $$A^1{}_n A^2{}_{1-n} B X^1{}_m X^2{}_{3-m} \qquad (1)$$

Wherein one of $A^1$ and $A^2$ represents methyl ammonium ($CH_3NH_3^+$) and the other of $A^1$ and $A^2$ represents formamidinium ($NH_2CH_2NH_2^+$), B represents a divalent metal ion, one of $X^1$ and $X^2$ represents $I^-$ and the other of $X^1$ and $X^2$ represents $Br^-$, n represents a number of 0 or more and less than 1, m represents a number of 0 or more and less than 3, and at least one of n and m is more than 0.

(9) The perovskite film according to (8), wherein both n and m are more than 0.

(10) The perovskite film according to (8) or (9), wherein $A^1$ is formamidinium, $A^2$ is methyl ammonium, n is 0.1 or more and 0.7 or less.

(11) The perovskite film according to any one of (8) to (10), wherein $X^1$ is $Br^-$, $X^2$ is $I^-$, m is 0.1 or more and 0.7 or less.

(12) The perovskite film according to any one of (8) to (11), wherein B is $Pb^{2+}$.

(13) The perovskite film according to any one of (1) to (7), comprising a perovskite compound represented by the following General Formula (2), $$M_r A^1{}_t A^2{}_{1-(r+t)} B X^1{}_m X^2{}_{3-m} \qquad (2)$$

Wherein M represents $Rb^+$, Cs or K, one of $A^1$ and $A^2$ represents methyl ammonium ($CH_3NH_3^+$) and the other of $A^1$ and $A^2$ represents is formamidinium ($NH_2CH_2NH_2^+$), B represents a divalent metal ion, one of $X^1$ and $X^2$ represents $I^-$ and the other of $X^1$ and $X^2$ represents $Br^-$, r represents a number of more than 0 and 0.1 or less, t represents a number of 0 or more and less than 0.9, m represents a number of 0 or more and less than 3, and at least one of t and m is more than 0.

(14) The perovskite film according to (13), wherein M is Rb+.
(15) The perovskite film according to (14), wherein both t and m are more than 0.
(16) The perovskite film according to (14) or (15) wherein $A^1$ is formamidinium, $A^2$ is methyl ammonium, and t is 0.1 or more and 0.7 or less.
(17) The perovskite film according to any one of (14) to (16), wherein, $X^1$ is Br−, X2 is I−, and m is 0.1 or more and 0.7 or less.
(18) The perovskite film according to any one of (14) to (17), wherein, B is $Pb^{2+}$.
(19) A perovskite film comprising a perovskite compound represented by the following General Formula (1'),

$(NH_2CH_2NH_2)_{n'}(CH_3NH_3)_{1-n'}PbBr_{m'}I_{3-m'}$  (1')

wherein n' and m' each independently represent 0 or a number of 0.1 or more and 0.7 or less, and at least one of n' and m' is 0.1 or more and 0.7 or less.
(20) The perovskite film according to (19), wherein both n' and m' are 0.1 or more and 0.7 or less.
(21) A perovskite film comprising a perovskite compound represented by the following General Formula (2'),

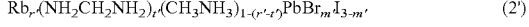

$Rb_{r'}(NH_2CH_2NH_2)_{t'}(CH_3NH_3)_{1-(r'-t')}PbBr_{m'}I_{3-m'}$  (2')

wherein r' represents a number of 0.01 or more and 0.1 or less, t' and m' each independently represent 0 or a number of 0.1 or more and 0.7 or less, and at least one of n' and m' is 0.1 or more and 0.7 or less.
(22) The perovskite film according to (21), wherein both t' and m' are 0.1 or more and 0.7 or less.
(23) A method for producing a perovskite film, comprising:
observing phase transition of two or more perovskite films having different atomic compositions within a predetermined temperature range to detect tendency of contribution of atomic composition ratio to suppression of the phase transition,
determining a better atomic composition for a perovskite film based on the tendency, and
producing a perovskite film having the better atomic composition.
(24) A method for producing a perovskite film, comprising:
observing formation of carrier traps in two or more perovskite films having different atomic compositions within a predetermined temperature range to detect tendency of contribution of atomic composition ratio to suppression of the carrier trap formation,
determining a better atomic composition for a perovskite film based on the tendency, and
producing a perovskite film having the better atomic composition.
(25) A light-emitting device comprising a light-emitting layer of the perovskite film according to any one of (1) to (22).
(26) A solar cell comprising the perovskite film according to any one of (1) to (22).

BRIEF DESCRIPTION OF DRAWINGS

FIG. 1A Absorption spectra, FIG. 1B SEM images with scale bars of 1 μm, and FIG. 1C, FIG. 1D XRD patterns of perovskite films and FIG. 1E, FIG. 1F TG and DSC properties of perovskite powders made from the precursor solutions used for PSC fabrication.
FIG. 2A is an Energy diagram of the four perovskites along with the other materials used in the PSCs.
FIG. 2B is a Representative current density-voltage curves of the best PSC for each perovskite measured with forward (−0.2 to 1.2 V) and reverse (1.2 to −0.2 V) scans at a scan rate of 50 mV s−1 and with a delay time of 2 s.
FIG. 2C shows EQE spectra of four PSCs based on different perovskites.
FIG. 2D shows Typical evolution curves of $J_{SC}$, $V_{OC}$, FF, and η under continuous one sun solar irradiation (100 mW cm−2, AM 1.5G) at 85° C. under open-circuit condition. To measure the evolution curves, each parameter was automatically measured every hour using a computer-controlled sourcemeter.
FIGS. 2E-2F show XRD, SEM and TSC characterizations of PSCs aged for 500 h at 85° C.
FIG. 3A show Current density-voltage curves of the best PSC measured with forward (−0.2 to 1.2 V) and reverse (1.2 to −0.2 V) scans at a scan rate of 50 mV s−1 and with a delay time of 2 s. The inset shows the detailed performance parameters.
FIG. 3B shows Electroluminescence EQE-voltage curves of the best PSC. The right inset shows the EL spectrum at 3.5 V. The inset image is a solar cell operated as an LED displaying a clearly visible red emission.
FIG. 3C-3D show Typical evolution curves of $J_{SC}$, $V_{OC}$, FF, and η under continuous one sun solar irradiation (100 mW cm−2, AM 1.5G) with thermal cycling between 25° C. and 85° C. according to the ISOS-T-1 standard under open-circuit condition. The temperature was switched around every one hundred hours.
FIG. 9A shows a Process-oriented ECM to which the spectra were fitted.
FIGS. 9B-9E show Selected impedance spectra showing the initial measurement at 25° C. (squares) and at the maximum temperature at 70° C. (diamonds) on the fresh and aged $MAPbI_3$ devices (black), fresh and aged $MA_{0.6}FA_{0.4}PbI_{2.8}Br_{0.2}$ devices (magenta).
FIGS. 9F-9I show Evolution of the resistances $R_0$, $R_1$ and $R_2$ determined by ECM fit from spectra measured during heating up at 25° C., 55° C. and 70° C. and subsequently cooling down to 55° C. and 25° C. again. Note that the color code is maintained throughout this figure. Fresh samples are indicated by full symbols and lines, aged samples by empty symbols and dashed lines. The square and diamond symbols of FIGS. 9B-9E are also indicated in FIGS. 9F-9I.

DETAILED DESCRIPTION OF INVENTION

We first correlate the phase transition with device properties such as conversion efficiency, degradation behavior, and lifetime at 85° C. for four kinds of lead-based perovskite materials with different combinations of halogens [bromine (Br) and iodine (I)] and organic components [methylammonium (MA) and formamidinium (FA)]. The chemical formulas of the perovskites used in this study are $MA_{0.6}FA_{0.4}PbI_3$, $MAPbI_{2.6}Br_{0.4}$, $MA_{0.6}FA_{0.4}PbI_{2.8}Br_{0.2}$, and $MAPbI_3$. Among them, the perovskite alloys ($MA_{0.6}FA_{0.4}PbI_3$, $MAPbI_{2.6}Br_{0.4}$, and $MA_{0.6}FA_{0.4}PbI_{2.8}Br_{0.2}$) do not exhibit a phase transition in the temperature range from room temperature to 200° C. while the pure perovskite $MAPbI_3$ has a phase transition at 54.6° C. and 56.2° C. for the exothermic and endothermic processes, respectively, as measured by differential scanning calorimetry. Furthermore, PSCs utilizing the pure perovskite and perovskite alloys as the light absorber demonstrated different degradation behavior under continuous light irradiation at 85° C. (Non-Patent Literature 18: Conings et al. 2015). Among the PSCs tested in this study, the $MA_{0.6}FA_{0.4}PbI_{2.8}Br_{0.2}$-based PSCs achieved the best thermal stability due to reduced carrier trap formation as confirmed by TSC analysis. We further fabricated $Rb_{0.05}MA_{0.55}FA_{0.4}PbI_{2.8}Br_{0.2}$ films for PSCs by incorporating rubidium iodide into the precursor solution used for the perovskite film fabrication. The inclusion of rubidium led to an open-circuit voltage of 1.21 V, which is the result of the lowest loss-of-voltage among all planar PSCs, and an improvement of both the conversion efficiency and device thermal stability in $Rb_{0.05}MA_{0.55}FA_{0.4}PbI_{2.8}Br_{0.2}$-based PSCs.

Figure 1A:
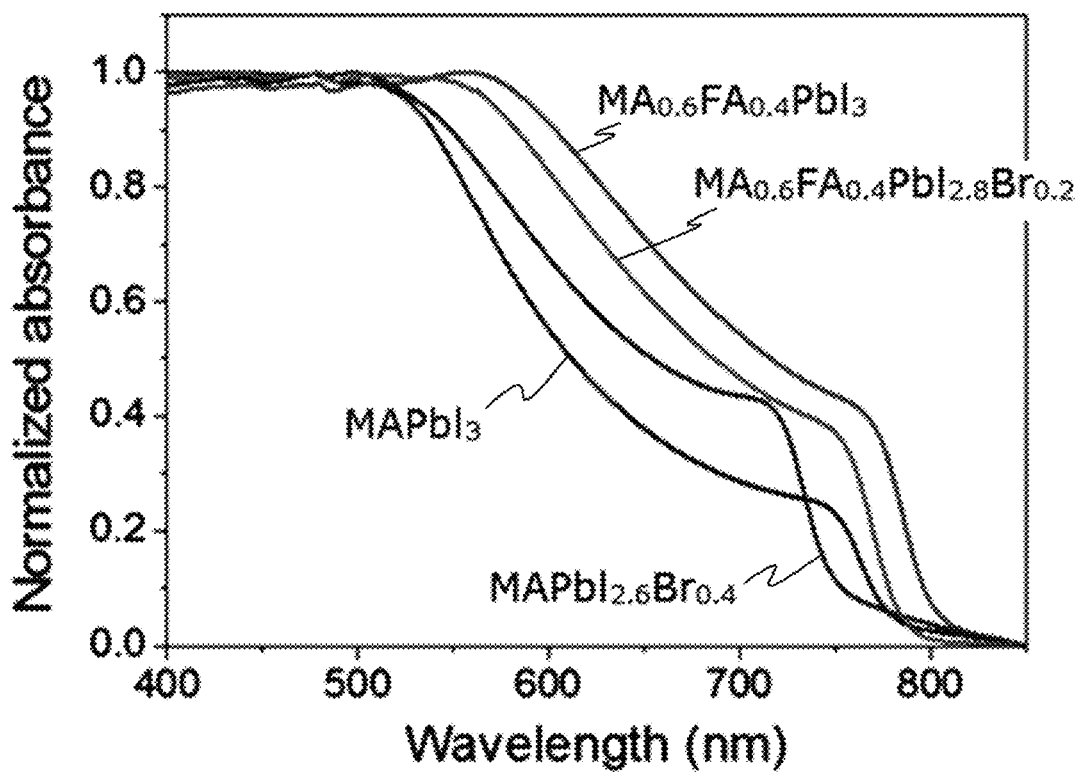
FIGS. 1A-1F: Optical, morphological, structural, and thermal properties of perovskite films with different compositions.
Figure 1B:
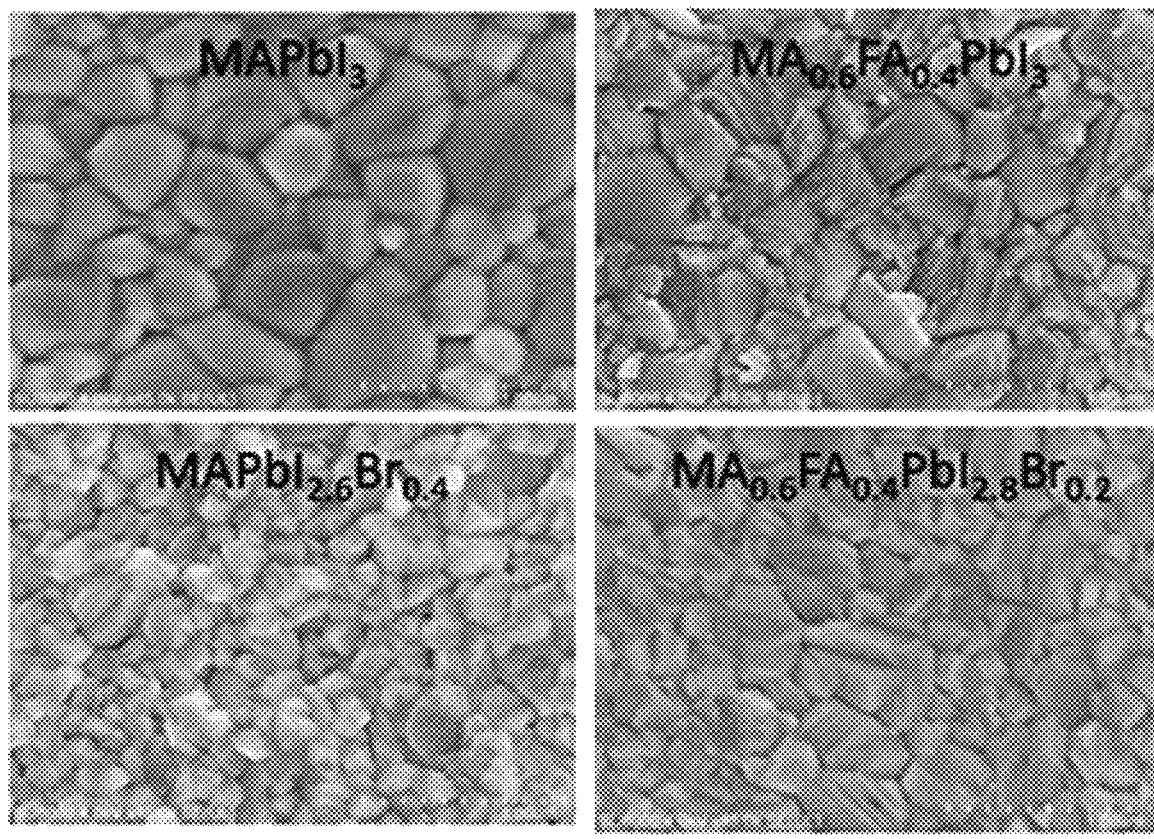

Since perovskite alloys have mainly been used in mesoporous solar cells with the perovskite alloy infiltrating a semiconductor scaffold (Non-Patent Literature 19, 20 and 21: Jeon et al. 2015; McMeekin et al. 20; Saliba et al. 2016), we first screened several types of perovskite materials, $MA_{0.6}FA_{0.4}PbI_3$, $MAPbI_{2.6}Br_{0.4}$, $MA_{0.6}FA_{0.4}PbI_{2.8}Br_{0.2}$, and $MAPbI_3$, to find the optimal components for high-performance planar devices. The spin-coated perovskite alloy films fabricated here have absorption characteristics similar to what has been previously reported: (Non-Patent Literature 19 and 20: Jeon et al. 2015; McMeekin et al. 2016) introduction of FA or Br into $MAPbI_3$ to yield $MA_{0.6}FA_{0.4}PbI_3$ and $MAPbI_{2.6}Br_{0.4}$ causes the absorption onset to shift to the red or blue, respectively, as shown in FIG. 1a. Because we optimized spin-coating conditions, such as the molar ratios of each component in the precursor solutions, toluene-dropping timing, and thermal annealing temperature and duration, for each film, all of our perovskite films showed smooth, uniform surfaces with full substrate coverage in scanning electron microscope (SEM) images (FIG. 1b), which leads to good device performance and stability.

Figure 1C:
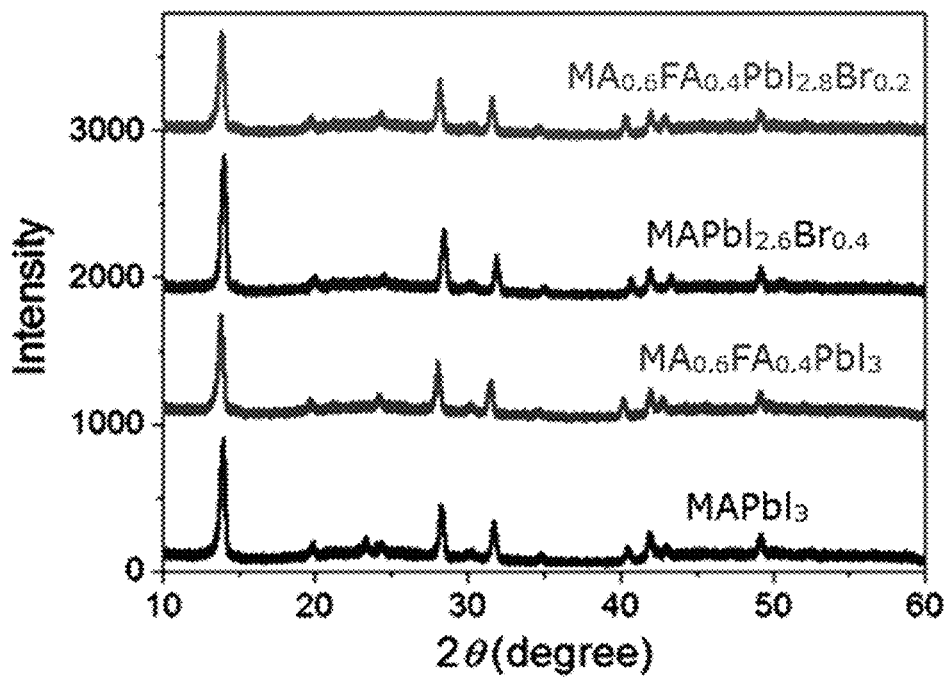
Figure 1D:
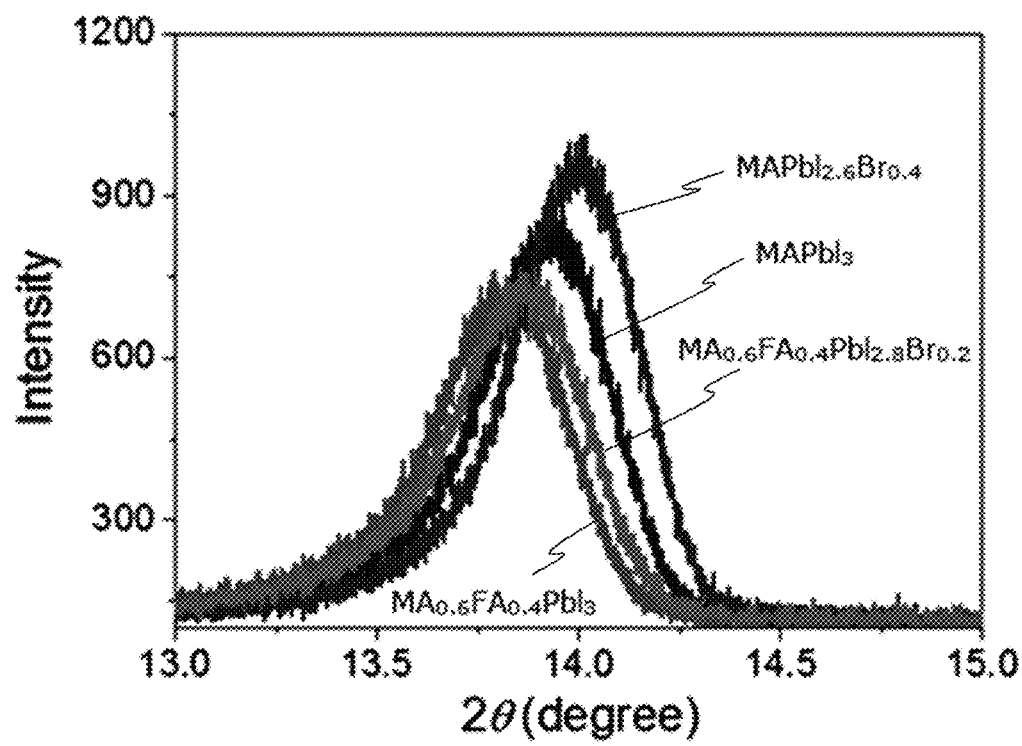

The X-ray diffraction (XRD) patterns of our perovskite films shown in FIGS. 1c and 1d indicate that the FA and/or Br are indeed being integrated into the $MAPbI_3$ crystal and forming $MA_{0.6}FA_{0.4}PbI_3$, $MAPbI_{2.6}Br_{0.4}$, $MA_{0.6}FA_{0.4}PbI_{2.8}Br_{0.2}$ alloys. A clear peak shift can be observed upon incorporating FA and/or Br, but all of the peaks can be indexed to the expected phases. The (110) diffraction peaks are slightly shifted to higher angles because of residual bromide while they move to lower angles when FA cations are added (Non-Patent Literature 19: Jeon et al. 2015). No evidence of secondary phases or unincorporated $PbI_2$ and organic cations was detected, which suggests that pure perovskite alloys were formed.

Figure 1E:
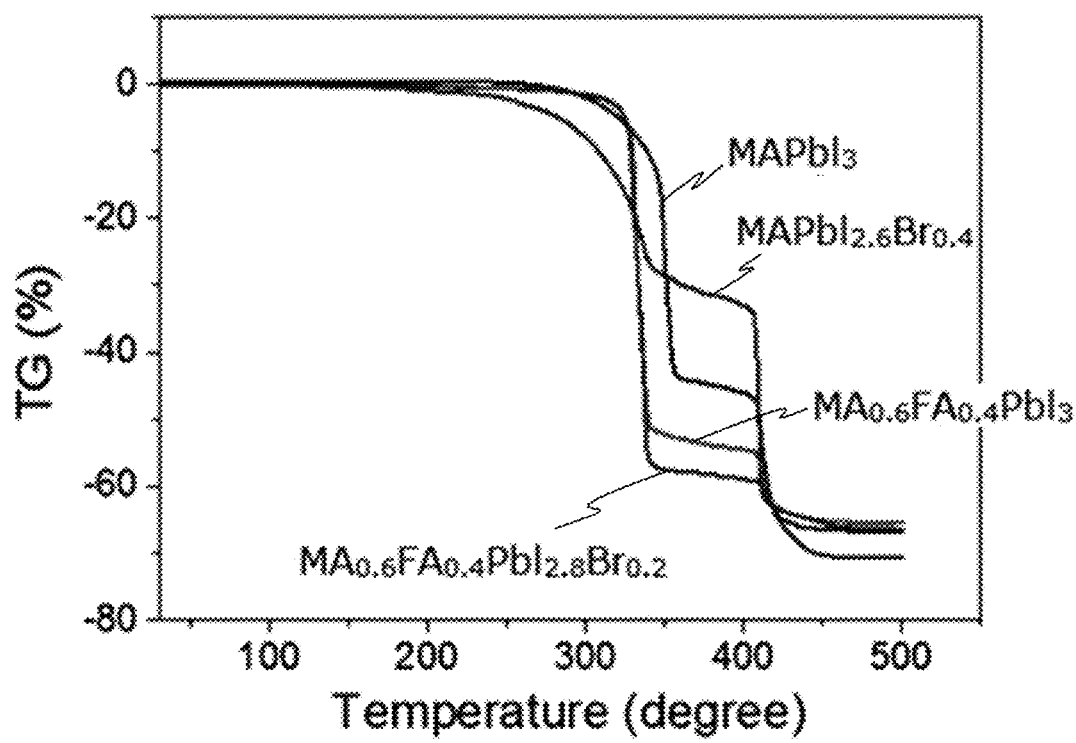

To understand the thermal properties of the perovskite alloy compounds, thermogravimetric analysis (TGA) and differential scanning calorimetry (DSC) were performed on $MA_{0.6}FA_{0.4}PbI_3$, $MAPbI_{2.6}Br_{0.4}$, $MA_{0.6}FA_{0.4}PbI_{2.8}Br_{0.2}$, and $MAPbI_3$ powders prepared by drying the precursor solutions used for the device fabrication at 100° C. for 30 min in a nitrogen-filled glove box. The TGA results in FIG. 1e show that $MA_{0.6}FA_{0.4}PbI_3$ and $MA_{0.6}FA_{0.4}PbI_{2.8}Br_{0.2}$ have similar thermal decomposition temperatures while the decomposition temperature of $MAPbI_3$ is as high as 300° C. On the other hand, $MAPbI_{2.6}Br_{0.4}$ has a relatively low decomposition temperature of around 200° C., which may be caused by phase separation of $MAPbI_{2.6}Br_{0.4}$ into $MAPbI_3$ and $MAPbBr_3$ (Non-Patent Literature 22: Rosales et al. 2016) At high temperatures, chemical decomposition and crystalline phase changes easily occur even in the case of the mixed halide perovskites.

Figure 1F:
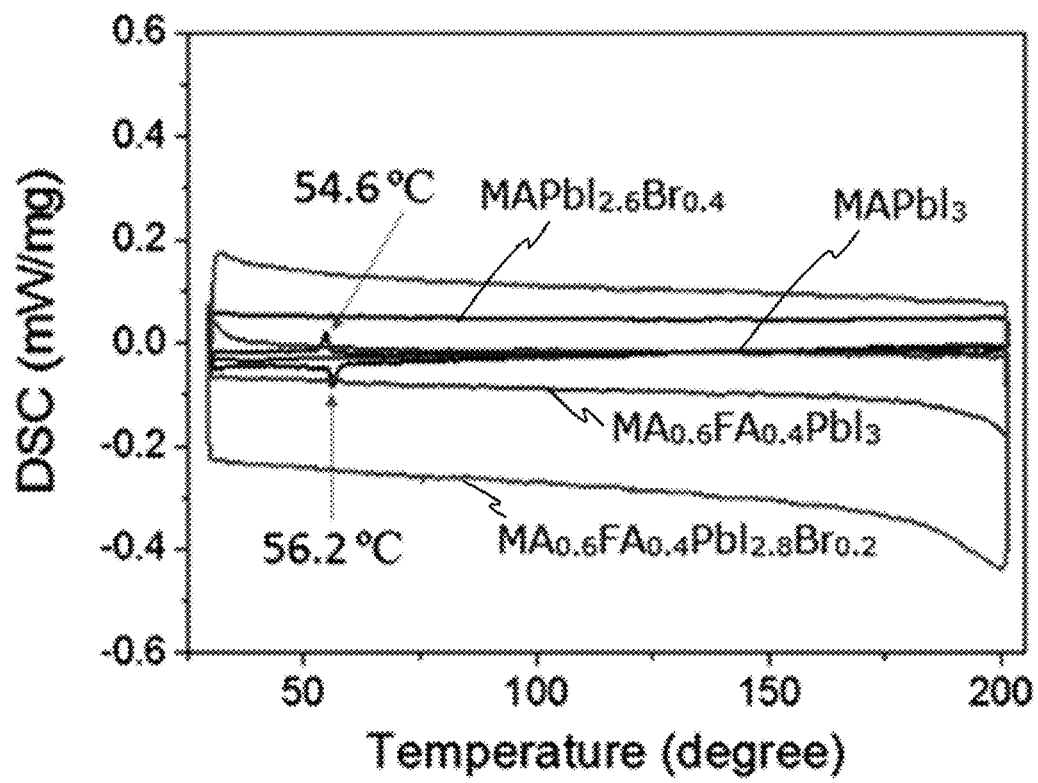

FIG. 1f displays DSC properties of the four perovskite powders. Similarly to the reported DSC properties of $MAPbI_3$ single crystals (Non-Patent Literature 16 and 23: Biakie et al. 2013; Stoumpos et al. 2013), a reversible phase transition between the tetragonal structure and the cubic structure was observed at 54.6° C. and 56.2° C. for the exothermic and endothermic processes, respectively. The other three perovskite alloys have no detectable phase transition between room temperature and 200° C., suggesting that possible phase-transition-related degradation may not exist in the perovskite-alloy-based PSCs during device operation at temperatures around 60° C., which is the normal surface temperature of solar cells under solar irradiation in high-attitude areas.

Figure 2A:
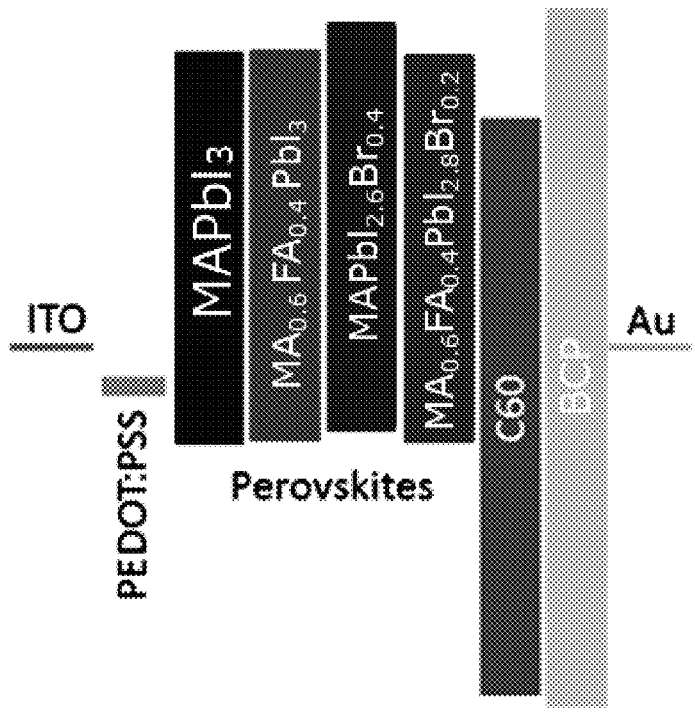
FIGS. 2A-2G: Device energy diagram, performance, lifetime, XRD, TSC and SEM images of planar PSCs with different compositions.
Figure 2B:
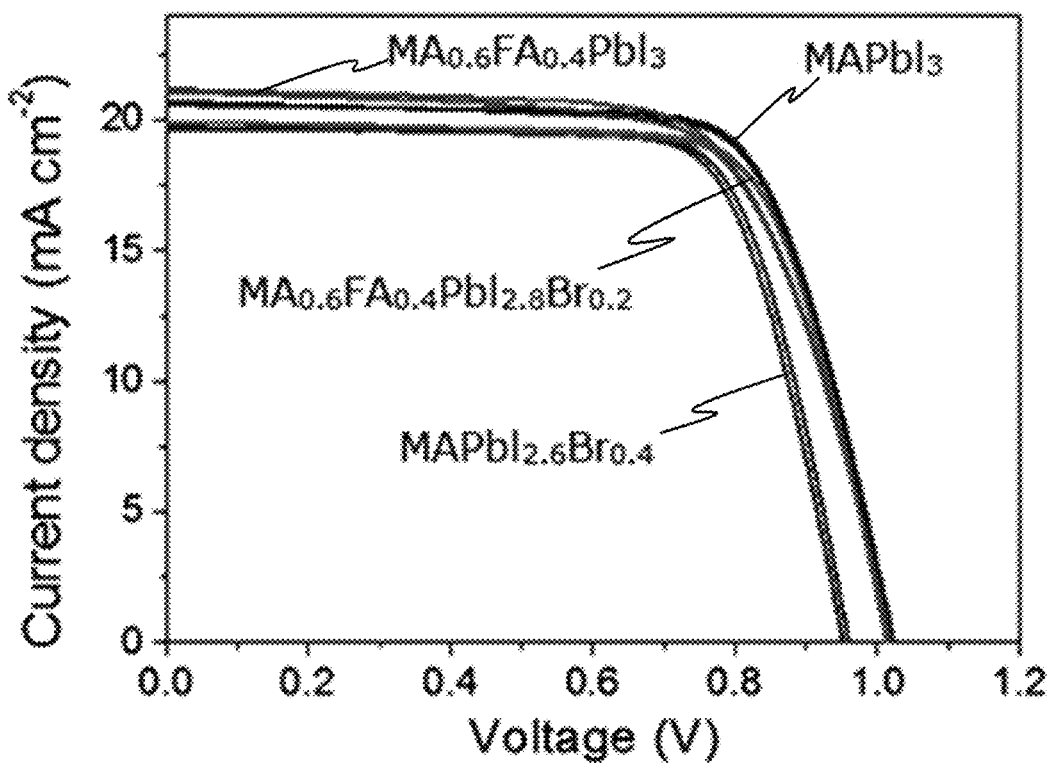

Solar cells were fabricated by spin coating the perovskite alloys and $MAPbI_3$ layers from precursor solutions, as detailed in the Methods section, on top of glass substrates coated with a layer of indium tin oxide (ITO) and a layer of poly(3,4-ethylenedioxythiophene)polystyrene sulfonate (PEDOT:PSS). To obtain uniform, flat perovskite films and similar device performance for unbiased comparison of the different compositions, we individually optimized spin-coating conditions for each perovskite film. While the PEDOT:PSS layer was fabricated in air, all of the perovskite layers were fabricated in a nitrogen-filled glove box to avoid any degradation in air. After deposition of $C_{60}$ (30 nm), bathocuproine (BCP, 10 nm), and gold on the perovskite layers, all of the PSCs were encapsulated in the glove box with a glass cap and UV sealant before being removed for evaluation in ambient air. FIG. 2b shows the current density-voltage curves of the PSCs when operated under illumination from a solar simulator equipped with a Xenon lamp (AM1.5G, 100 mW cm$^{-2}$). The values of short-circuit current density ($J_{SC}$), open-circuit voltage ($V_{OC}$), fill factor (FF), and power conversion efficiency ($\eta$) estimated from the current density-voltage curves are summarized in Table 1.

TABLE 1

Solar cell performance of the PSCs using different perovskites.

| Device | Jsc/mA cm$^{-2}$ | Voc/V | FF | $\eta$/% |
|---|---|---|---|---|
| $MA_{0.6}FA_{0.4}PbI_3$ | 21.31 | 1.02 | 0.67 | 14.66 |
| $MAPbI_{2.6}Br_{0.4}$ | 19.97 | 0.95 | 0.74 | 14.01 |
| $MA_{0.6}FA_{0.4}PbI_{2.8}Br_{0.2}$ | 20.14 | 1.01 | 0.73 | 14.83 |
| $MAPbI_3$ | 20.93 | 1.02 | 0.72 | 15.35 |

Figure 2C:
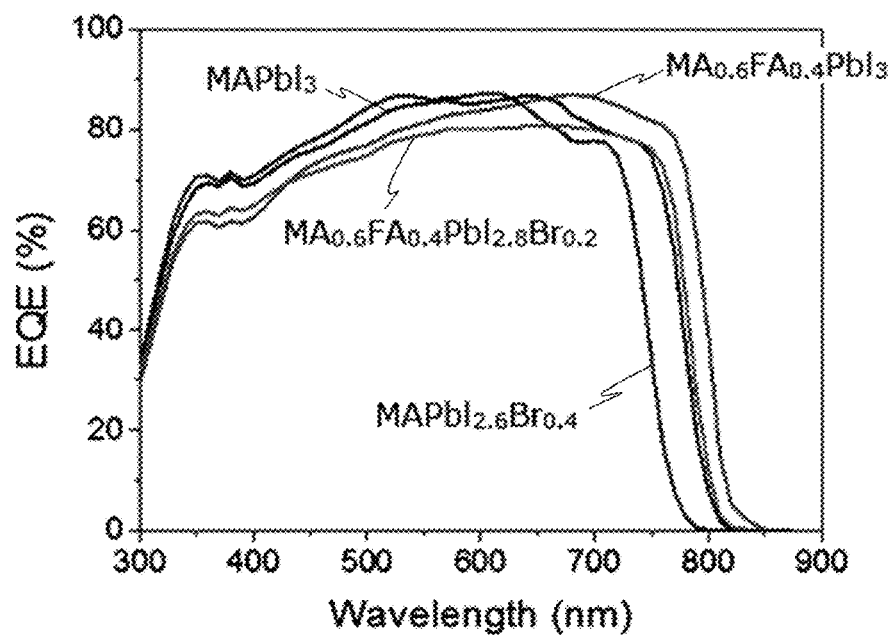

The $CH_3NH_3PbI_3$-based PSC exhibited $J_{SC}$=20.93 mA cm$^{-2}$, $V_{OC}$=1.02 V, FF=0.72, and $\eta$=15.35% when measured under a forward bias scan. An enhanced $J_{SC}$ of 21.31 mA cm$^{-2}$ for the $MA_{0.6}FA_{0.4}PbI_3$-based PSC is attributed to a broader external quantum efficiency (EQE) spectrum as shown in FIG. 2c, which is consistent with the red-shifted absorption spectrum of $MA_{0.6}FA_{0.4}PbI_3$. The $J_{SC}$ (19.97 mA $cm^{-2}$) was lower for the $MAPbI_{2.6}Br_{0.4}$-based PSC because of the blue-shifted absorption spectrum. For the $MA_{0.6}FA_{0.4}PbI_{2.8}Br_{0.2}$-based PSC, we obtained $J_{SC}$=20.14 mA $cm^2$, $V_{OC}$=1.01 V, FF=0.73, and η=14.83%. All of the PSCs demonstrated comparable performance and negligible hysteresis because of their similar film morphologies and optical and electronic properties, which is important for reliable study and comparison of the device stability.

To discuss the influence of the perovskite composition on the stability without effects from UV-induced perovskite degradation complicating the results, white light-emitting diodes (WLEDs) were used as the light source. We firstly screened the high-temperature stability of the four kinds of PSCs under continuous light irradiation of 500 h at 85° C. Two regimes with different degradation speeds are observed in FIG. 2d for all of the solar cells: an initial quick degradation within the first 100 h (namely, a burn-in period), followed by a slow, relatively linear degradation. During the burn-in period, $J_{SC}$ and FF decreased while $V_{OC}$ slightly increased in PSCs of perovskite alloys. The efficiency was reduced by only 12% during the burn-in period for PSCs based on $MA_{0.6}FA_{0.4}PbI_{2.8}Br_{0.2}$, which is smaller than the nearly 50% decrease for the other PSCs after 100 h of high-temperature operation. After the burn-in stage, the loss of η decelerates for the $MAPbI_3$, $MA_{0.6}FA_{0.4}PbI_3$, and $MAPbI_{2.0}Br_{0.4}$ PSCs. The $MA_{0.6}FA_{0.4}PbI_{2.8}Br_{0.2}$ PSC was the most stable, maintaining around 80% of its initial efficiency after 500 h, and exhibited a slight increase in η after burn-in before then entering a linear degradation period. Note that the main decrease of η originates from a decrease of FF, which suggests that the efficiency and stability could be further improved by systematic interface engineering.

Figure 2D:
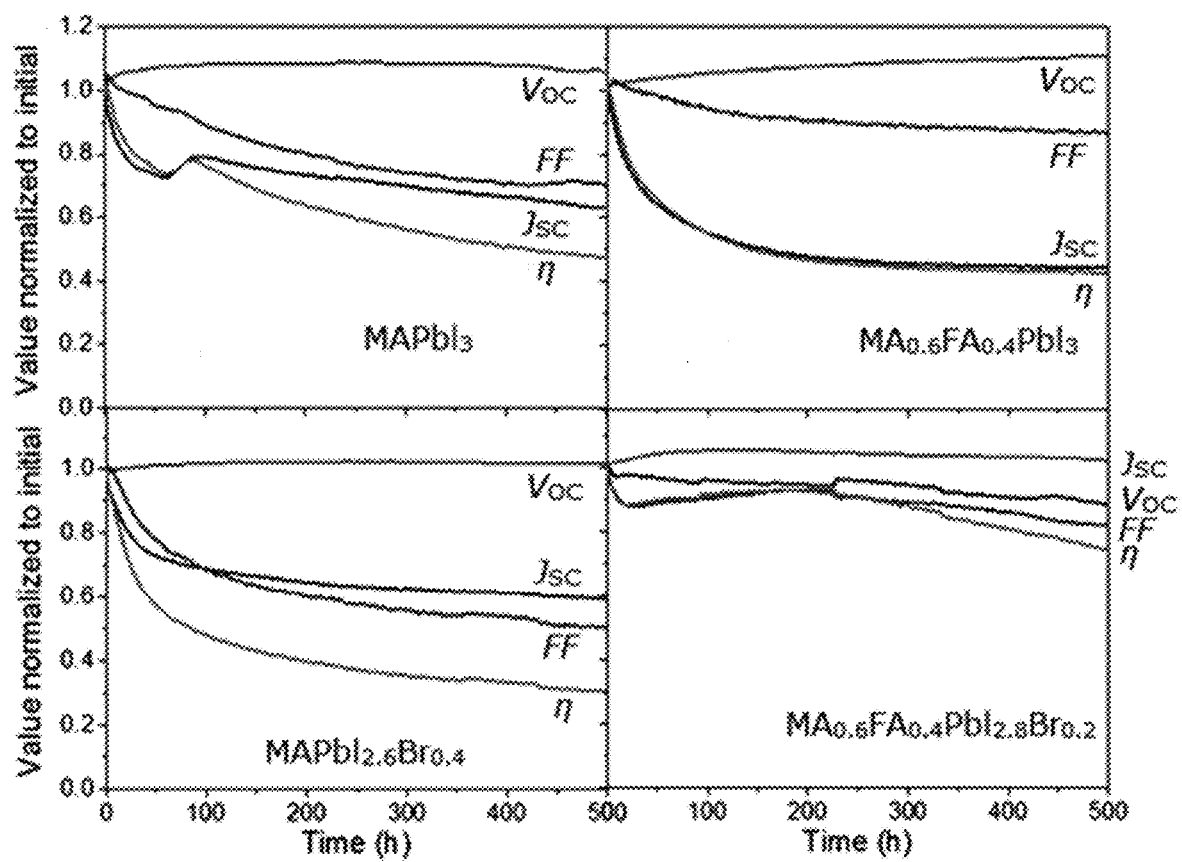
Figure 2E:
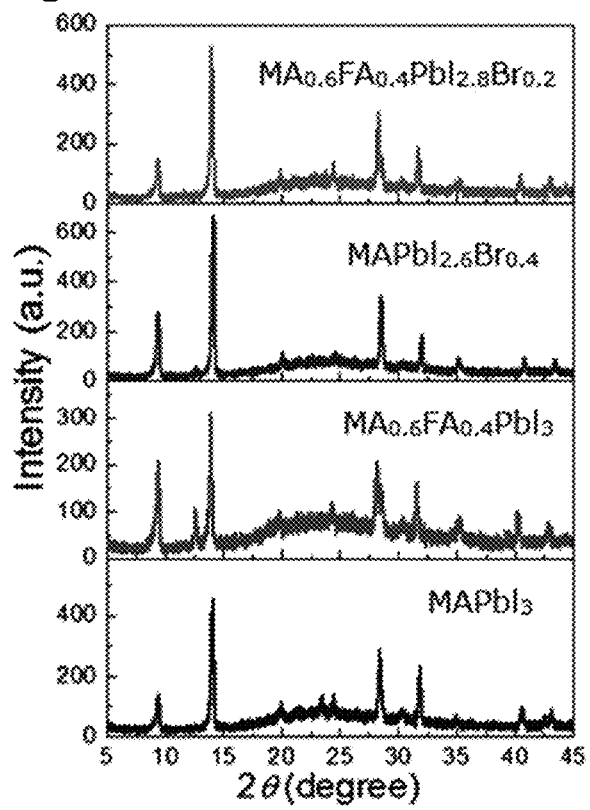

FIG. 2e shows XRD patterns of the degraded samples. Strong diffraction peaks at 9.4° and weak diffraction peaks at 12.6° can be attributed to MAI and $PbI_2$, respectively. These indicate that a larger amount of MAI was produced after degradation of all four types of perovskites at high temperature with continuous light irradiation (Non-Patent Literature 24: Juarez-Perez et al. 2016). Because of protection imparted by the top metal electrode, the thermally volatile MAI could be kept inside the perovskite layers and detected by XRD after peeling off the metal electrode. Indeed, in our previous study, only a stronger diffraction peak for $PbI_2$ was observed in a degraded device without encapsulation operated under room temperature (Non-Patent Literature 12: Qin et al. 2016). However, MAI might not be a key factor leading to degraded device performance because MAI similarly appeared in the degraded $MA_{0.6}FA_{0.4}PbI_{2.8}Br_{0.2}$ PSC, which had a much more stable η. This suggests that a certain amount of Schottky defects, such as $MA^+$, $Pb^{2+}$, and $I^-$, are not seriously detrimental to long-term stability of the PSCs.

Figure 2F:
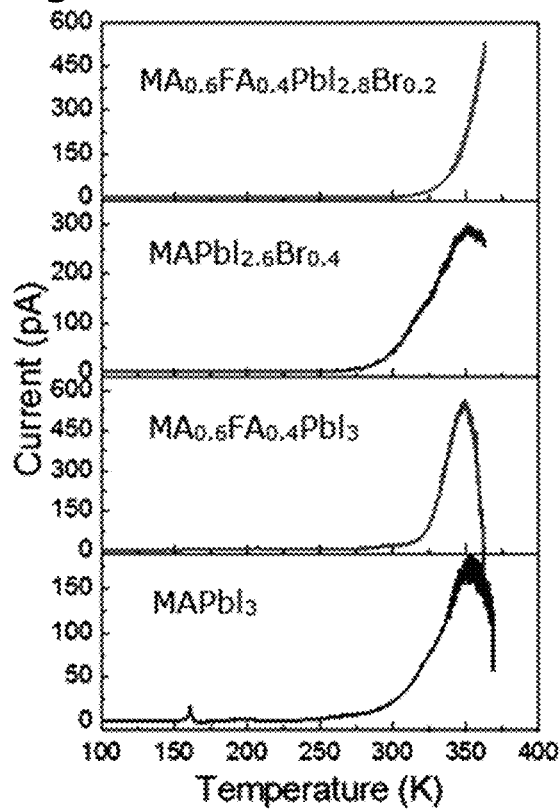

SEM surface images (FIG. 2f) of degraded PSCs were measured after peeling off the gold electrode. Some $C_{60}$ and BCP might still remain on top of the perovskite because of stronger adhesion force between them than with the inorganic metal. The PSCs with mixed cations and anions showed significant morphological changes and the formation of large pin-holes compared with the fresh films, and some small pin-holes also appeared in the degraded $MAPbI_3$ PSC. Only the $MA_{0.6}FA_{0.4}PbI_{2.8}Br_{0.2}$ film maintained full coverage.

Figure 2G:
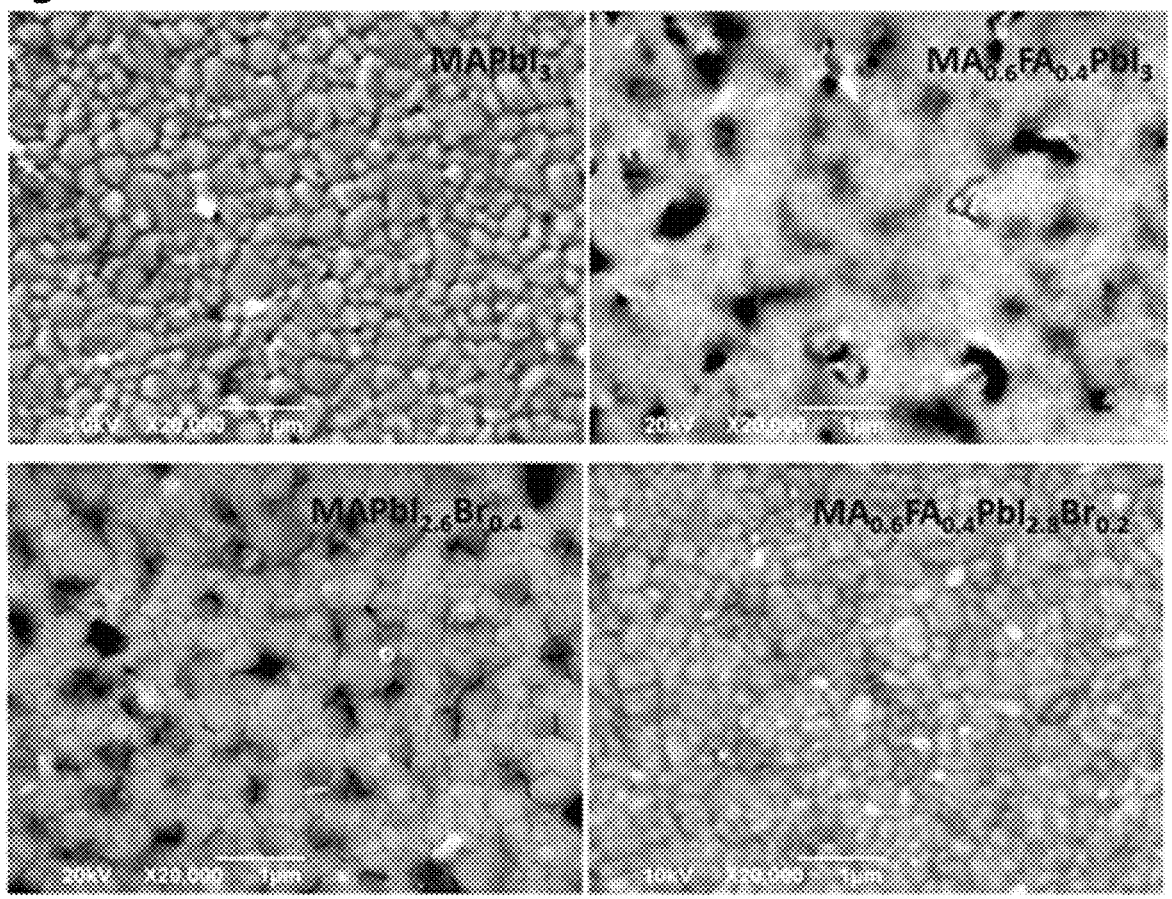

In TSC profiles measured for PSCs degraded by 500 h of illumination at 85° C. (FIG. 2g), carrier traps were not detected in the degraded $MA_{0.6}FA_{0.4}PbI_{2.8}Br_{0.2}$ PSC, which would be consistent with it having the best device stability (Non-Patent Literature 25: Ahn et al. 2016). In the other three aged devices, similar TSC peaks were observed at approximately 350 K that could be ascribed to the traps caused by interface deterioration between perovskite and the cathode, which is consistent with significant morphological changes and the formation of pin-holes as shown in SEM images (Non-Patent Literature 26: Kawano et al. 2009). Note that no detectable carrier traps were found in the high-performance fresh devices, and also no such phase-transition-related traps were observed in the fresh and aged devices when the stability test was performed at room temperature, as was previously reported (Non-Patent Literature 12: Qin et al. 2016). Furthermore, we found that mesoporous-$TiO_2$-based perovskite solar cells produced complex TSC signals with bad reproducibility. Use of inverted device structures with PEDOT:PSS as hole-transporting layer is important to obtain reliable TSC results.

Figure 4:
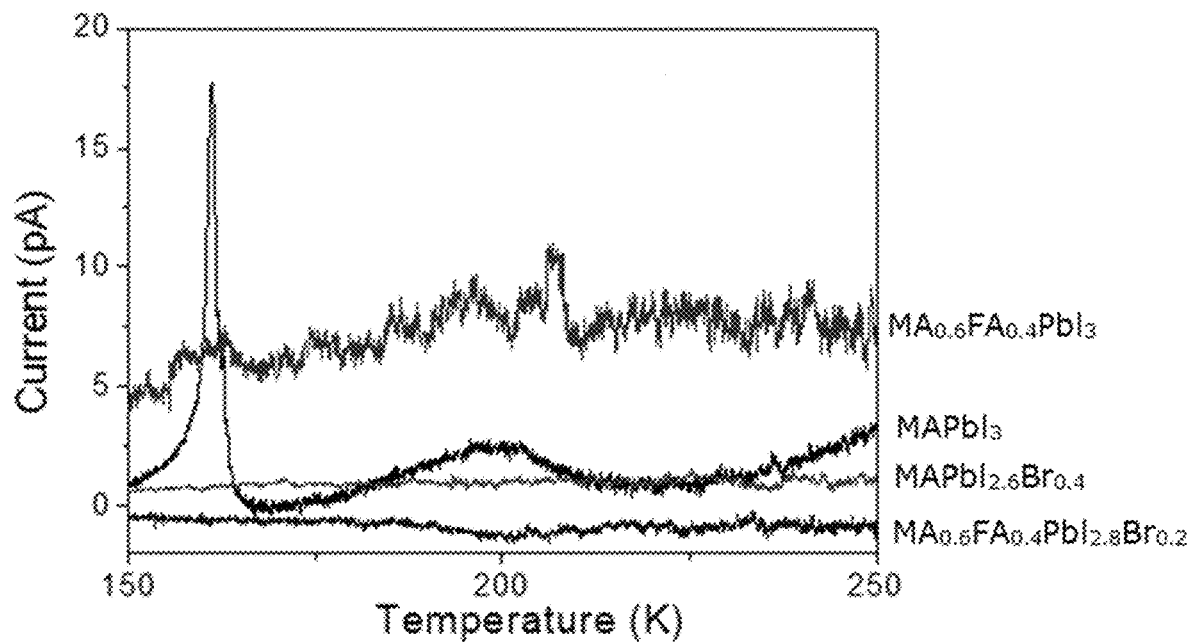
FIG. 4: TSC curves at low temperature region of aged PSCs after 500 h at 85° C.

The TSC profile of $MAPbI_3$ PSC was more complex. Two TSC peaks were observed at 161 K and 201 K, indicating the formation of two kinds of carrier traps with corresponding trap depths of 0.32 eV and 0.41 eV, respectively. The presence of carrier traps related to the low-temperature phase transition is consistent with previous reports (Non-Patent Literature 11 and 12: Baumann et al. 2015 and Qin et al. 2016). However, no detectable signals were observed in this temperature range in the degraded PSCs based on perovskite alloys (see FIG. 4), confirming that the use of perovskite alloys can suppress the formation of shallow carrier traps under continuous light irradiation. Moreover, a large number of deep traps at temperatures over 300 K, which covers the high-temperature phase transition (around 330 K) from the tetragonal to cubic phase, are generated in the degraded $MAPbI_3$ PSC. This proves that these carrier traps are caused by continuous heating and light irradiation are detrimental to device stability (Non-Patent Literature 27: Wu et al. 2015). We believe that high-temperature phase transition from tetragonal to cubic could accelerate defect formation around grain boundaries through changes in the crystalline lattice.

Similar TSC curves were observed in the degraded $MAPbI_{2.6}Br_{0.4}$ device, which had a degradation behavior similar to that of the $MAPbI_3$ PSC as shown in FIG. 2d. This can be ascribed to the formation of phase of pure, semi-crystalline $MAPbI_3$ due to phase separation of $MAPbI_{2.6}Br_{0.4}$, which has already be observed in a previous study (Non-Patent Literature 22: Rosales et al. 2016). These results show that morphological changes in addition to the formation of carrier traps occur at high temperatures, providing an additional reason why $MAPbI_3$-based devices are unstable under high temperature. Note that we repeated all degradation experiments and other characterization at least three times to confirm the reliability of the results.

Figure 5:
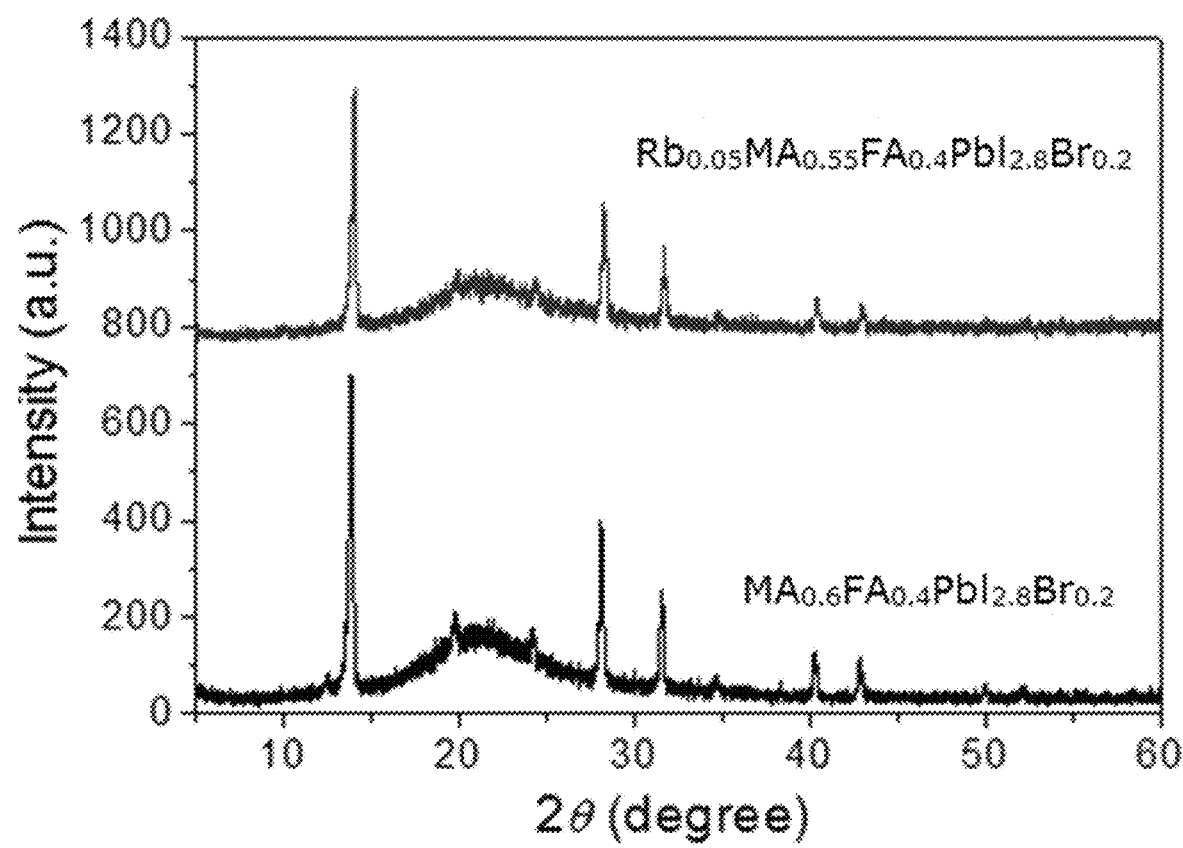
FIG. 5: XRD pattern of two perovskites with and without Rb ions.
Figure 6:
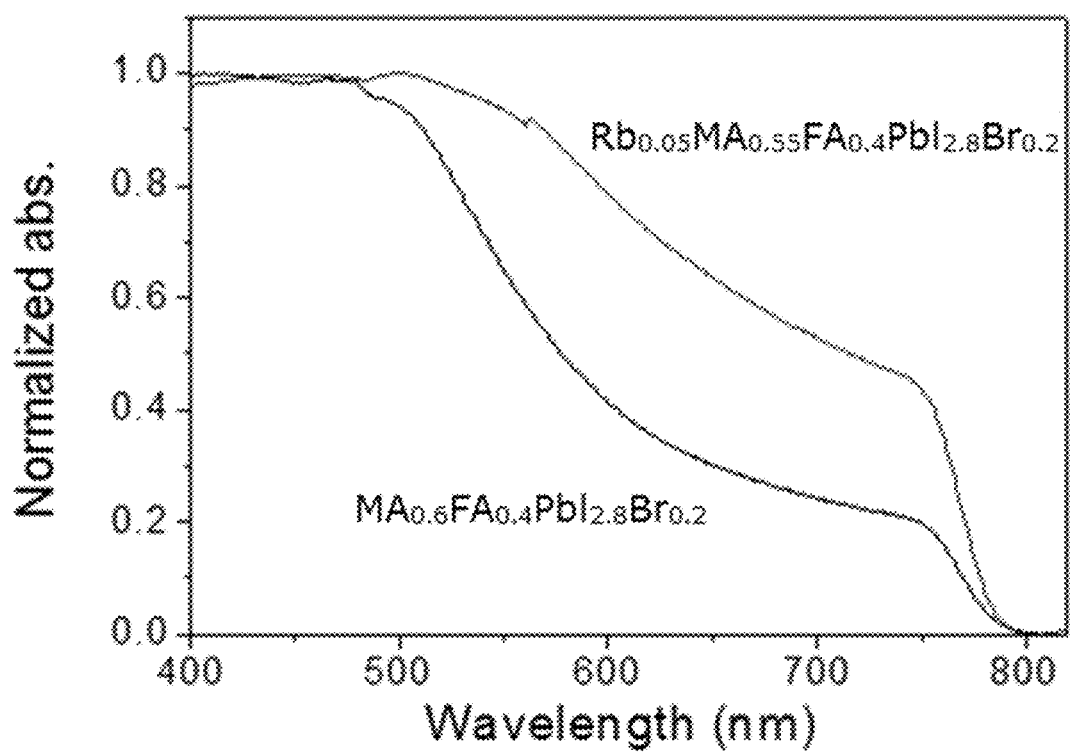
FIG. 6: UV-vis absorption spectra of two perovskites with and without Rb ions.
Figure 7:
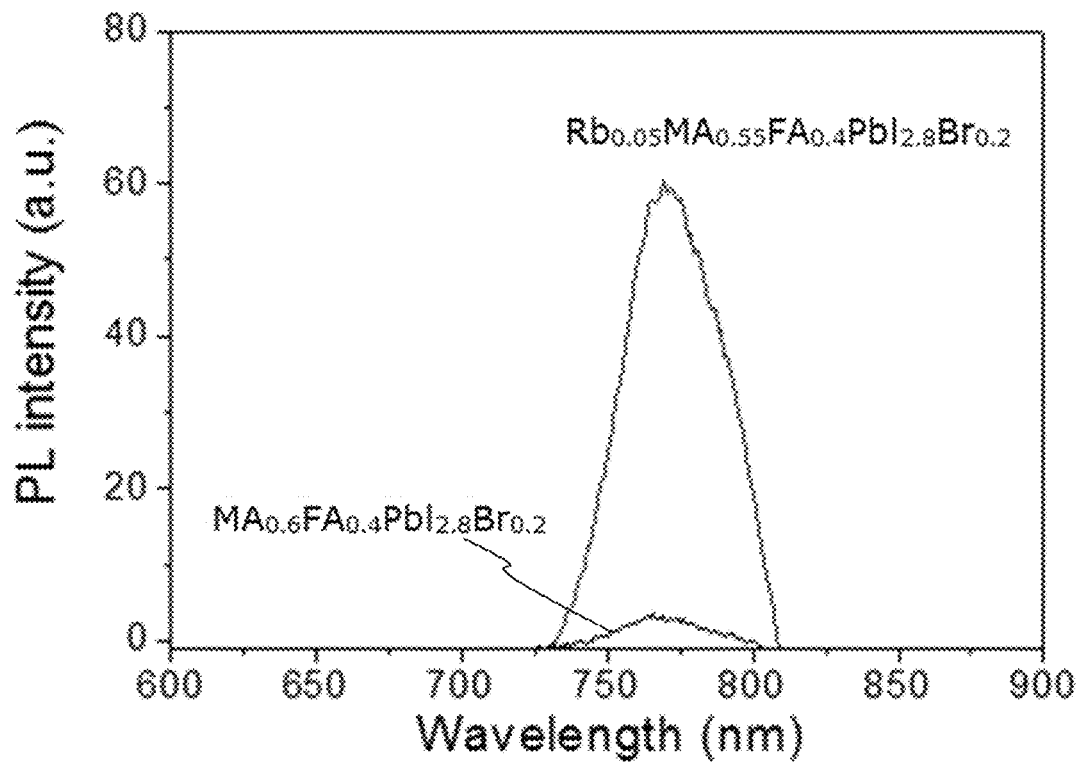
FIG. 7: PL spectra of two perovskites with and without Rb ions.

Based on these results and recent reports (Non-Patent Literature 21: Saliba et al 2016), we introduced rubidium (Rb) ions into the mixed perovskite to form $Rb_{0.05}MA_{0.55}FA_{0.4}PbI_{2.8}Br_{0.2}$. The suitable ionic radius of Rb (152 pm) should maintain an appropriate Goldschmidt tolerance factor between 0.8 and 1.0, which can be calculated by $t=r_A+r_X/[2(r_B+r_X)]^{1/2}$, where r represents the ionic radii of the corresponding ions of $ABX_3$, and lead to a three-dimensional perovskite (Non-Patent Literature 28: Goldschmidt 1926). The low-angle XRD peaks for perovskite films with and without Rb ion occur at 13.8° and 14.0°, respectively, revealing that Rb is indeed incorporated into the crystal lattice (see FIG. 5) (Non-Patent Literature 29: Zhang et al. 2017). Upon adding Rb, the absorption edge was almost unchanged, but the excitonic absorption was strengthened (FIG. 6). Furthermore, the intensity of the photoluminescence (PL) peak at around 770 nm was enhanced by a factor of 20 by incorporating Rb (FIG. 7), suggesting that incorporation of Rb could suppress non-radiative decay in the perovskite.

Figure 3A:
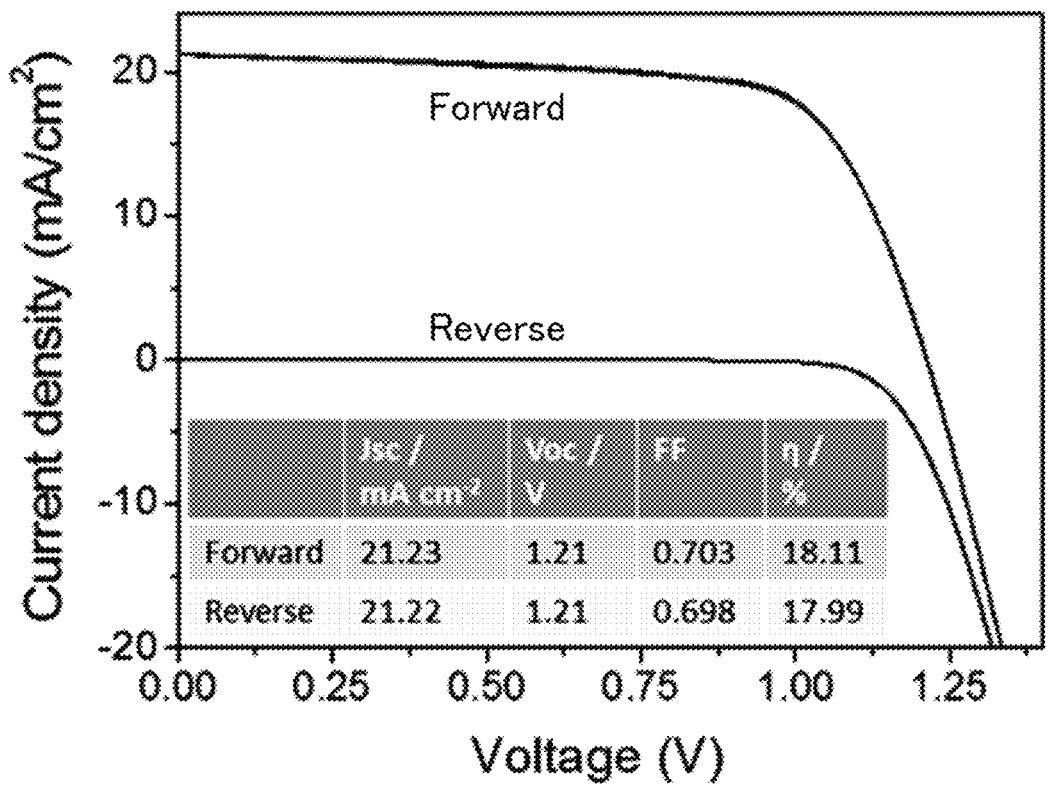
FIGS. 3A-3D: Device performance and lifetime characterization of champion solar cell and reference.
Figure 3B:
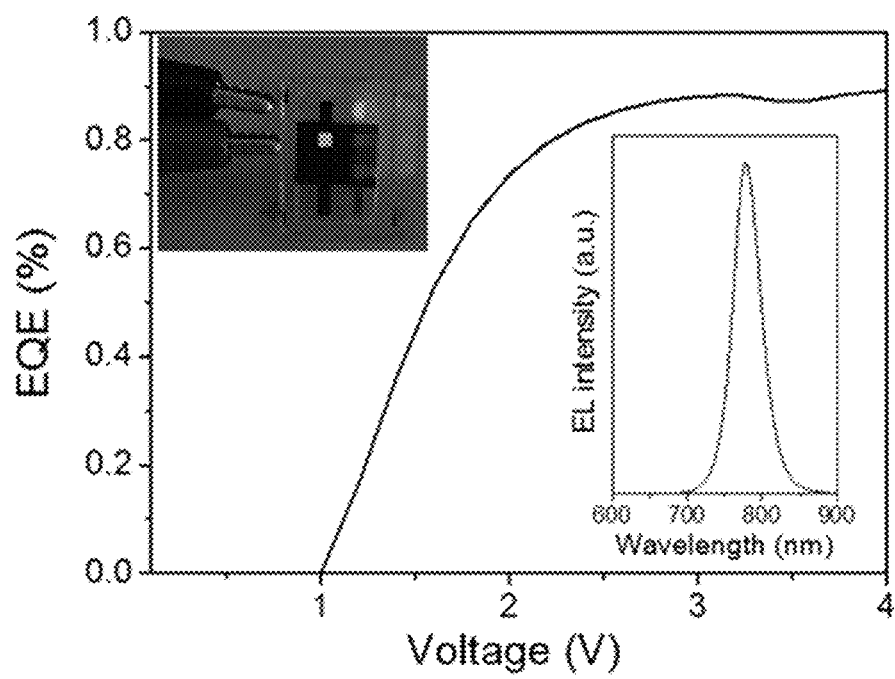
Figure 8:
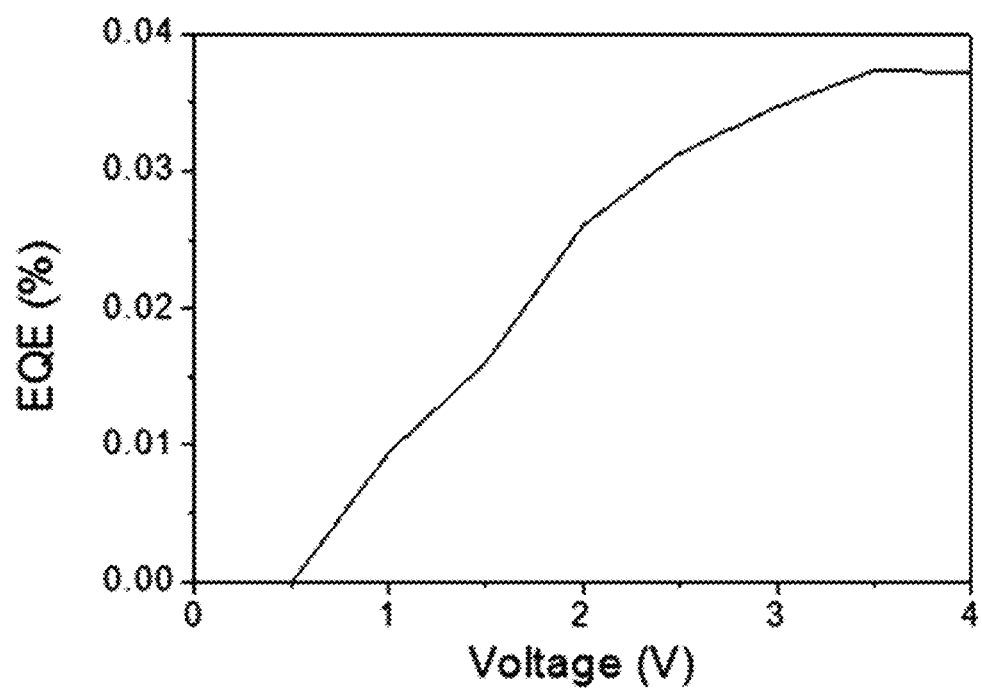
FIG. 8: EQE electroluminescence-voltage curves of the $MA_{0.6}FA_{0.4}PbI_{2.8}Br_{0.2}$ PSC

Using the same inverted PSC architecture with Rb-doped perovskite as the absorber, a champion η of 18.11% was achieved with a $J_{SC}$ of 21.23 mA cm$^{-2}$, a $V_{OC}$ of 1.21 V and a FF of 0.70, as shown in FIG. 3a. The device exhibited negligible photocurrent hysteresis. The outstanding $V_{OC}$ of 1.21 V is the result of the lowest reported loss-of-voltage in any planar inverted PSC, implying very small non-radiative recombination losses. This was confirmed by measuring the electroluminescence (EL) external quantum efficiency ($EQE_{EL}$) properties, as shown in FIG. 3b, for the same structure. A maximum $EQE_{EL}$ of 0.9% was obtained with an EL peak at 777 nm in the NIR spectral range (see the inset image) while the maximum $EQE_{EL}$ of the undoped sample was 0.037% (see FIG. 8). The excellent photovoltaic and EL performance of our Rb-perovskite devices indicates that non-radiative recombination was strongly suppressed, which can likely be attributed to the reduction of defect density in the bulk film or at the film surface.

Figure 3C:
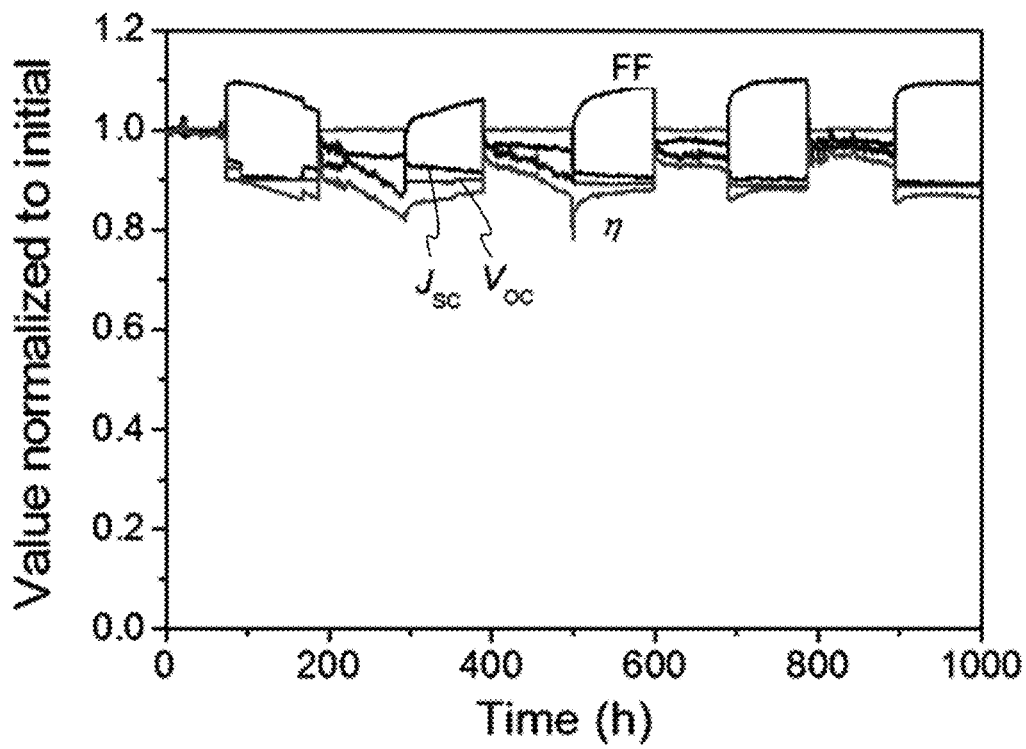
Figure 3D:
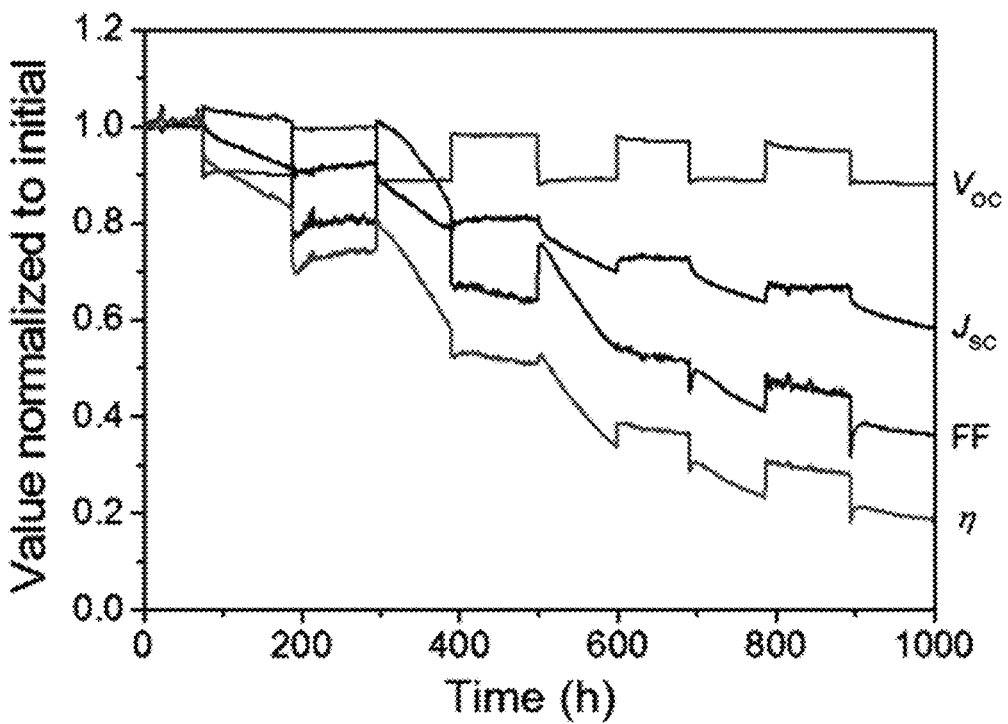

According to the earlier discussion of device stability, a reduction of carrier traps will contribute to improving the device stability. To further confirm the thermal stability of the new Rb-perovskite alloy and the influence of the phase transition, we perform thermal cycling tests using standard ISOS-T-1 thermal cycling (Non-Patent Literature 17: Roesch et al. 2015). FIGS. 3c and 3d show the evolution curves of $Rb_{0.05}MA_{0.55}FA_{0.4}PbI_{2.8}Br_{0.2}$- and $MAPbI_3$-based devices during thermal cycling between 25° C. and 85° C. (5 cycles) under continuous light irradiation. At first, both devices were extremely stable under the initial test period at 25° C., indicating high quality devices (Non-Patent Literature 15: Qin et al. 2017). When the device temperature was initially raised to 85° C., η dropped around 7% compared with that at 25° C. because of a decrease in $V_{OC}$ for both types of perovskites. This loss in $V_{OC}$ is consistent with previous results and could be caused by increased recombination (Non-Patent Literature 9: Divitini et al. 2016).

As the devices continued to operate at 85° C., efficiency only slightly reduced under continuous heating and light irradiation in the case of the Rb-perovskite-alloy-based device. On the contrary, the performance of the $MAPbI_3$-based device quickly decreased because of a reduction in $J_{SC}$, which is similar to the previous results. When the temperature returned to 25° C., the device performance of Rb-perovskite slightly increased, owing to a recovery of the $V_{OC}$, and then reduced at a slow rate that continued to decrease after further cycles. However, the efficiency of the $MAPbI_3$ PSC did not recover as much because of a significant drop in FF despite a recovery of $V_{OC}$.

The degradation is further seen in the second high-temperature operation region, during which the $J_{SC}$, FF, and η continuously and greatly decrease. The reduction of FF means the morphology and interface became worse. As a comparison, Rb-perovskite-based device still showed similar behavior as during the first cycle and with only a small amount of degradation. In the later three cycles, the Rb-perovskite-based device became more stable with smaller variations in FF and almost no change in the other two parameters. After all five cycles, its η remained at 87% of its initial. In contrast, η of the $MAPbI_3$ PSC maintained only 18% of its initial η.

Figure 9A:
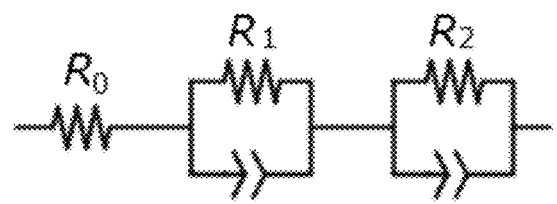
FIGS. 9A-9I: Impedance analysis of the devices.
Figure 9B:
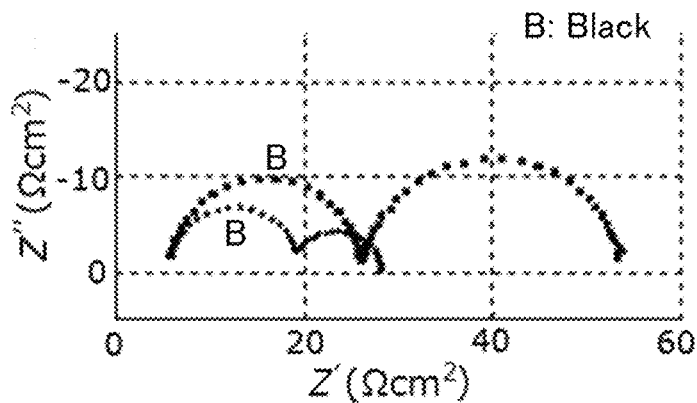
Figure 9C:
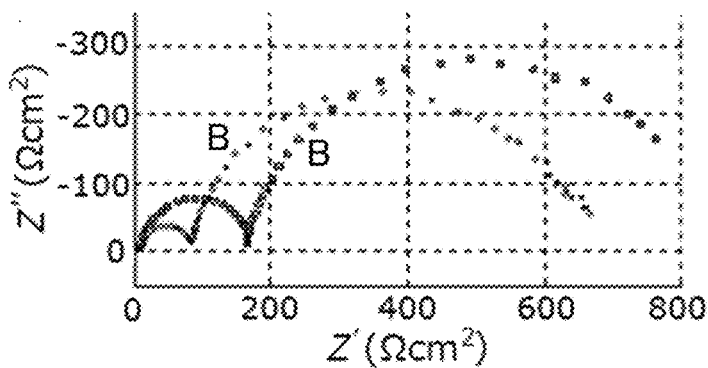
Figure 9D:
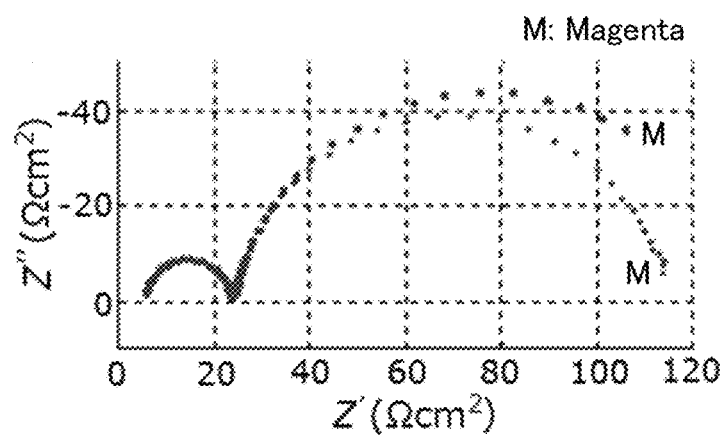
Figure 9E:
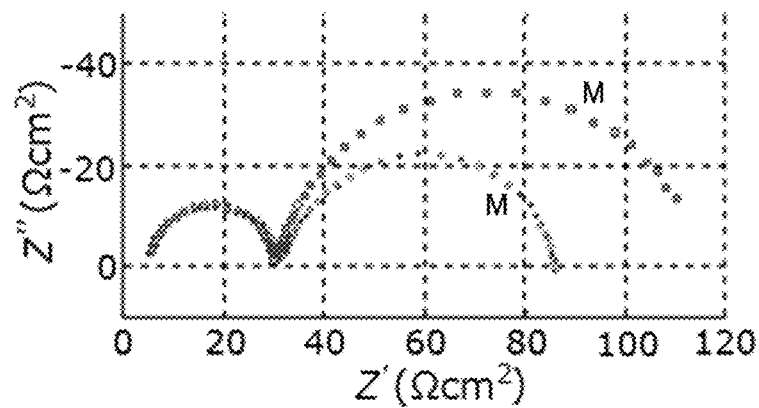
Figure 9F:
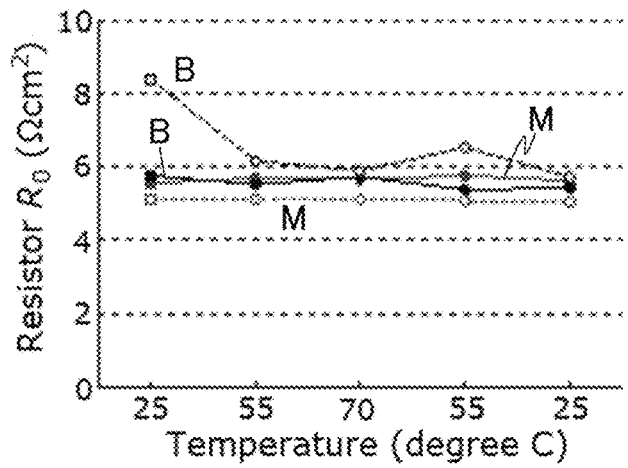
Figure 9G:
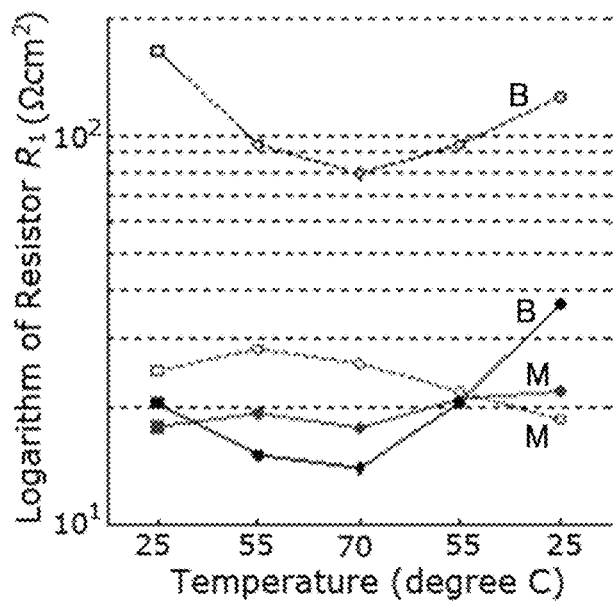
Figure 9H:
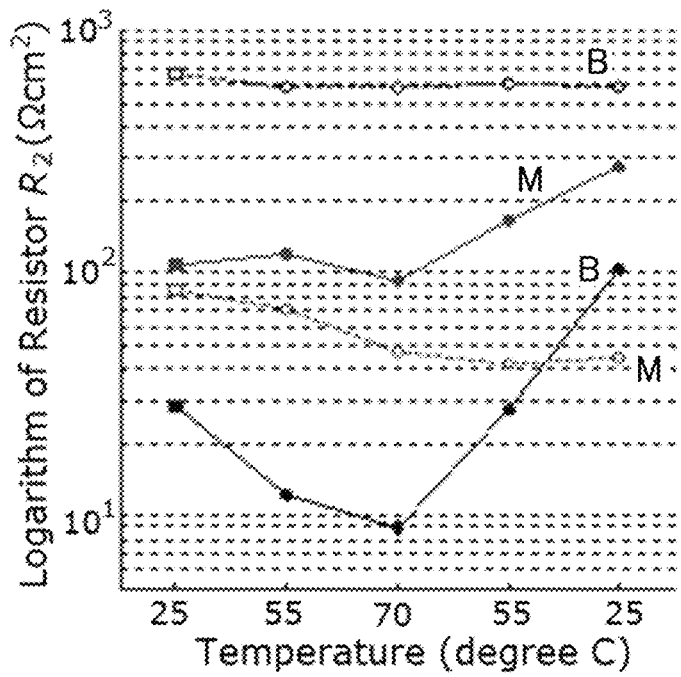
Figure 9I:
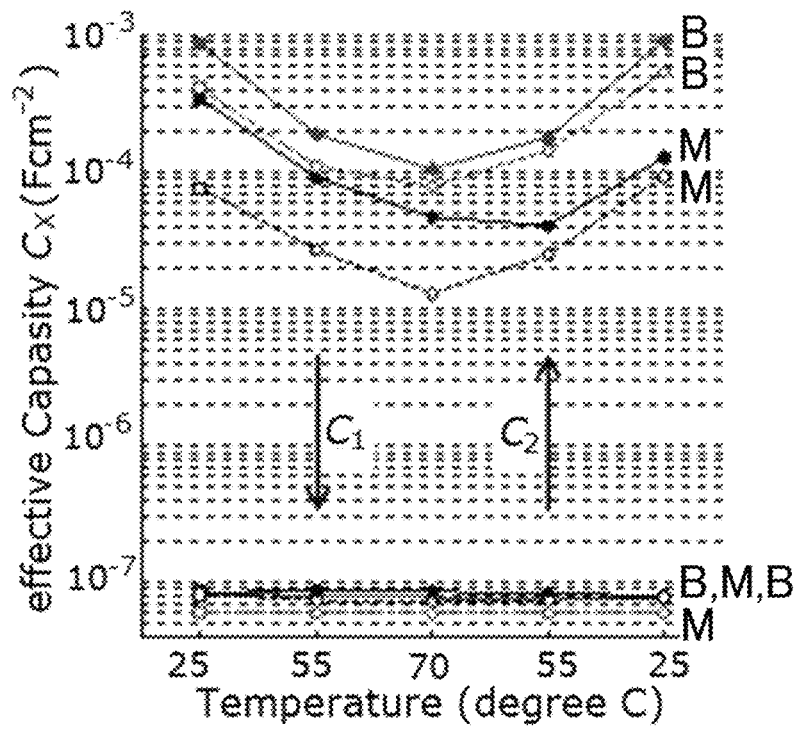

To further understand the relationship between phase transition and device degradation, we selected two perovskites based devices for EIS measurements (Non-Patent Literature 28 and 29: Goldschmidt 1926 and Zhang et al. 2017), fresh and aged for 500 h $MAPbI_3$ and $MA_{0.6}FA_{0.4}PbI_{2.8}Br_{0.2}$ devices, respectively. EIS was performed at 25° C., 55° C. and 70° C. during heating and again at the same temperatures during cooling down. A waiting time of 10 min was inserted prior to each measurement to ensure thermal equilibrium. It is noteworthy that we also measured current density-voltage curves before and after each EIS. The parameters FF, η, $J_{se}$, and $V_{oc}$ did not show any distinct trend during these tests, and device performance was not affected by the EIS measurements. The obtained spectra were fitted to a simple process-oriented equivalent circuit model (ECM) as shown in FIG. 9a. This might be a significant simplification, but we think it is appropriate for this qualitative analysis. Moreover, it has been shown that the values determined with this circuit are comparable to other models, such as the basic model shown in Reference 28. None of the spectra measured in this study showed negative loops. The spectra measured initially at 25° C. and at 70° C. for fresh and aged $MAPbI_3$ and $MA_{0.6}FA_{0.4}PbI_{2.8}Br_{0.2}$ devices are shown in FIGS. 9b-e, respectively. The evolution of the resistances $R_0$, $R_1$ and $R_2$ is plotted in FIG. 9f, g and h. We also calculated the effective capacities, $C_1$ and $C_2$, from the respective resistances, $R_x$, and time constants, $\tau_x$, of the RQ subcircuits (parallel connection of resistor and constant phase element): $C_x=\tau_x/R_x$. These are shown in FIG. 9i.

The Ohmic resistances, $R_0$, for all samples lie between 5.04 and 5.73 Ωcm$^2$ after the temperature treatment (FIG. 9f), so we exclude a serious contact loss due to morphology changes as reason for the degradation of the aged $MAPbI_3$ device. Further, it is apparent that both the fresh and the aged $MA_{0.6}FA_{0.4}PbI_{2.8}Br_{0.2}$ devices do not show any change in the high frequency arc due to the increased temperature, whereas fresh and aged $MAPbI_3$ devices exhibit a significant decrease of its diameter at 70° C. The origin of this process cannot be attributed exclusively to bulk or interface effects yet. There is some controversy in the literature and we do not want to over-interpret the impedance results at this point. However, $R_1$ shows a distinct dependency on the temperature for $MAPbI_3$ devices and it was mainly attributed to the bulk perovskite in the past. It could be caused by removal of carrier traps due to the phase transition after heating up the device beyond the phase equilibrium temperature. Successive cooling down will then consequently result in the formation of an increased number of carrier traps as compared to the initial state. Repeated cycling probably increases the overall number of these traps, which would explain the 10-fold increase of $R_1$ for the aged $MAPbI_3$ device. The related capacity $C_1$ exhibits values <10$^{-7}$ Fcm$^{-2}$ for all measured spectra, which suggests that it is a geometrical capacitance. The good agreement of all values for $C_1$ is another strong indication that the degradation of the aged $MAPbI_3$ device was not caused by morphological changes, which are expected to come along with a significant decrease of $C_1$.

Another noticeable feature in this series is the reduction of $R_2$ of the fresh $MAPbI_3$ device during the first heating, from 28 Ωcm$^2$ at 25° C. to 9 Ωcm$^2$ at 70° C., indicating a serious change in $MAPbI_3$ device whereas $R_2$ for the $MA_{0.6}FA_{0.4}PbI_{2.8}Br_{0.2}$ device is almost unaffected by the first heat treatment. However, all fresh samples show an increase in $R_2$ after cooling down, which is attributed to the state before device recovery, as will be discussed below. $R_2$ has been attributed to the interfaces or a coupled electronic-ionic impedance, where the distribution of ions strongly influences charge carrier recombination, which in turn would be expected to happen predominantly at the interfaces. Still, we think the following observations are unlikely to be caused by a morphology change: (i) the 68.6% drop in $R_2$ for the fresh $MAPbI_3$ device at 70° C., and (ii) the increase of $R_2$ for $MAPbI_3$ by almost two orders of magnitude after ageing without affecting $R_0$ or $C_1$. Rather, we see these results as a further indication that the phase transformation during heat treatment of the $MAPbI_3$ device introduces additional carrier traps and that these are the main reason for the reduced thermal stability of this material.

Figure 10:
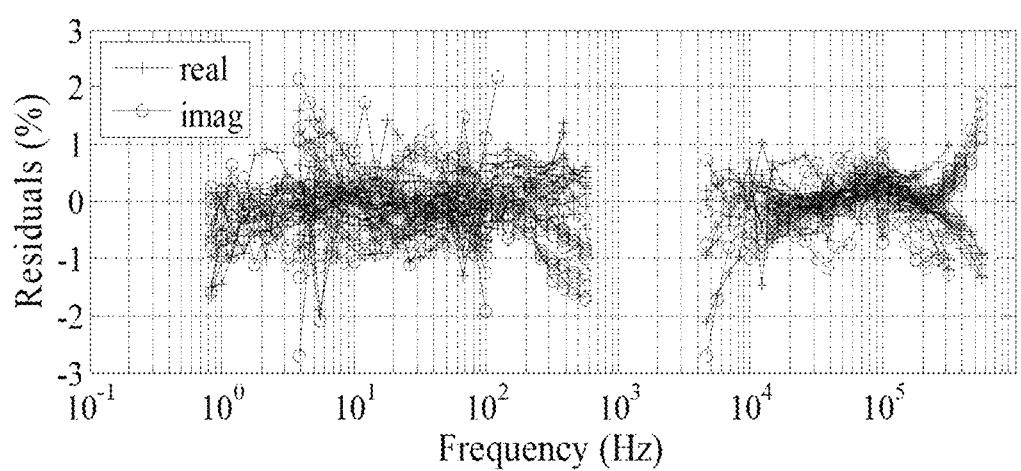
FIG. 10: Residuals for the impedance fits. In this figure, all residuals for the fits that lead to the parameters in Table S2 are overlaid in one diagram. Note that the fit was performed in two stages because also the impedance spectra were recorded in two steps in order to be able to use optimized settings for the measurement at high and low frequencies.

It is obvious from the impedance analysis of fresh and aged devices that $MAPbI_3$ shows a distinct degradation upon temperature cycling already for one thermal cycle as well as for the device after the 500 h aging test, whereas the $MA_{0.6}FA_{0.4}PbI_{2.8}Br_{0.2}$ device is robust against heat treatments up to 70° C. for all tests discussed in this section. All model parameters and the residuals for the fits are provided in FIG. 10 and Table 2.

introduction of rubidium ions, device performance of perovskite-alloy-based solar cells were further improved owing to reduced defects and non-radiative recombination. Finally, perovskite solar cells with improved thermal stability were realized, with η dropping only 13% after five thermal cycles under continuous light irradiation of 1,000 h. We believe that the present findings offer insight to help obtain efficient and stable organic-inorganic hybrid perovskite solar cells for future applications.

Materials and Methods

Device Fabrication and Characterization. Glass substrates coated with prepatterned ITO layers with a thickness of ~150 nm (ATSUGI MICRO) and sheet resistance of 12 Ω/sq. were cleaned sequentially by ultrasonicating in a detergent solution, pure water, acetone, and isopropanol for 10 min each and then subjected to UV/ozone treatment for 15 min. A thin layer (~50 nm) of PEDOT:PSS (Clevios, A14083) was prepared by spin coating at 3000 rpm for 45 s on top of ITO in air using a poly(tetrafluoroethylene) syringe filter with a 0.45 μm pore diameter, followed by baking the PEDOT:PSS layer at 160° C. for 10 min. The

TABLE 2

Fit parameters obtained from the impedance analysis. The equivalent circuit used is displayed in Fig. 9a in the main article. Listed are the resistances, $R_x$, the time constants, $\tau_x$, and the exponents, $n_x$, for the constant phase elements. The capacitances, $C_x$, are the effective capacitances calculated by $C_x = \tau_x/R_x$.

| | $R_0$ (Ω cm$^2$) | $R_1$ (Ω cm$^2$) | $\tau_1$ (s) | $C_1$ (Fcm$^{-2}$) | $n_1$ | $R_2$ (Ω cm$^2$) | $\tau_2$ (s) | $C_2$ (Fcm$^{-2}$) | $n_2$ |
|---|---|---|---|---|---|---|---|---|---|
| MAPbI$_3$ (fresh) | | | | | | | | | |
| #1 (25° C.) | 5.77 | 20.42 | 1.73 · 10$^{-6}$ | 8.46 · 10$^{-8}$ | 0.98 | 28.42 | 9.82 · 10$^{-3}$ | 3.45 · 10$^{-4}$ | 0.88 |
| #2 (55° C.) | 5.53 | 15.11 | 1.33 · 10$^{-6}$ | 8.79 · 10$^{-8}$ | 0.98 | 12.24 | 1.11 · 10$^{-3}$ | 9.04 · 10$^{-5}$ | 0.93 |
| #3 (70° C.) | 5.73 | 13.96 | 1.20 · 10$^{-6}$ | 8.63 · 10$^{-8}$ | 0.98 | 8.91 | 4.19 · 10$^{-4}$ | 4.70 · 10$^{-5}$ | 0.97 |
| #4 (55° C.) | 5.40 | 20.68 | 1.72 · 10$^{-6}$ | 8.34 · 10$^{-8}$ | 0.98 | 27.39 | 1.13 · 10$^{-3}$ | 4.12 · 10$^{-5}$ | 0.89 |
| #5 (25° C.) | 5.41 | 36.89 | 2.94 · 10$^{-6}$ | 7.97 · 10$^{-8}$ | 0.98 | 103.73 | 1.31 · 10$^{-2}$ | 1.27 · 10$^{-4}$ | 0.85 |
| MAPbI$_3$ (aged) | | | | | | | | | |
| #1 (25° C.) | 8.41 | 165.35 | 1.37 · 10$^{-5}$ | 8.28 · 10$^{-8}$ | 0.96 | 662.12 | 5.05 · 10$^{-2}$ | 7.63 · 10$^{-5}$ | 0.89 |
| #2 (55° C.) | 6.15 | 94.82 | 7.05 · 10$^{-6}$ | 7.43 · 10$^{-8}$ | 0.96 | 580.94 | 1.56 · 10$^{-2}$ | 2.68 · 10$^{-5}$ | 0.88 |
| #3 (70° C.) | 5.89 | 79.88 | 5.79 · 10$^{-6}$ | 7.25 · 10$^{-8}$ | 0.96 | 582.19 | 7.62 · 10$^{-3}$ | 1.31 · 10$^{-5}$ | 0.86 |
| #4 (55° C.) | 6.53 | 95.11 | 7.01 · 10$^{-6}$ | 7.37 · 10$^{-8}$ | 0.97 | 602.52 | 1.49 · 10$^{-2}$ | 2.47 · 10$^{-5}$ | 0.88 |
| #5 (25° C.) | 5.73 | 125.34 | 9.68 · 10$^{-6}$ | 7.73 · 10$^{-8}$ | 0.96 | 581.30 | 5.35 · 10$^{-2}$ | 9.21 · 10$^{-5}$ | 0.91 |
| MA$_{0.6}$FA$_{0.4}$PbI$_{2.8}$Br$_{0.2}$ (fresh) | | | | | | | | | |
| #1 (25° C.) | 5.57 | 17.81 | 1.55 · 10$^{-6}$ | 8.70 · 10$^{-8}$ | 0.98 | 108.03 | 9.51 · 10$^{-2}$ | 8.80 · 10$^{-4}$ | 0.87 |
| #2 (55° C.) | 5.69 | 19.35 | 1.56 · 10$^{-6}$ | 8.08 · 10$^{-8}$ | 0.99 | 120.65 | 2.30 · 10$^{-2}$ | 1.90 · 10$^{-4}$ | 0.88 |
| #3 (70° C.) | 5.64 | 17.71 | 1.40 · 10$^{-6}$ | 7.90 · 10$^{-8}$ | 0.98 | 92.74 | 9.79 · 10$^{-3}$ | 1.06 · 10$^{-4}$ | 0.88 |
| #4 (55° C.) | 5.77 | 21.10 | 1.59 · 10$^{-6}$ | 7.52 · 10$^{-8}$ | 0.98 | 163.99 | 2.94 · 10$^{-2}$ | 1.79 · 10$^{-4}$ | 0.84 |
| #5 (25° C.) | 5.62 | 22.03 | 1.67 · 10$^{-6}$ | 7.58 · 10$^{-8}$ | 0.97 | 276.10 | 2.54 · 10$^{-1}$ | 9.22 · 10$^{-4}$ | 0.77 |
| MA$_{0.6}$FA$_{0.4}$PbI$_{2.8}$Br$_{0.2}$ (aged) | | | | | | | | | |
| #1 (25° C.) | 5.11 | 24.81 | 1.49 · 10$^{-6}$ | 6.02 · 10$^{-8}$ | 0.98 | 85.08 | 3.48 · 10$^{-2}$ | 4.10 · 10$^{-4}$ | 0.87 |
| #2 (55° C.) | 5.12 | 28.32 | 1.67 · 10$^{-6}$ | 5.91 · 10$^{-8}$ | 0.98 | 71.29 | 7.94 · 10$^{-3}$ | 1.11 · 10$^{-4}$ | 0.92 |
| #3 (70° C.) | 5.13 | 25.90 | 1.54 · 10$^{-6}$ | 5.95 · 10$^{-8}$ | 0.97 | 47.16 | 3.71 · 10$^{-3}$ | 7.86 · 10$^{-5}$ | 0.98 |
| #4 (55° C.) | 5.09 | 21.96 | 1.30 · 10$^{-6}$ | 5.94 · 10$^{-8}$ | 0.98 | 42.06 | 6.13 · 10$^{-3}$ | 1.46 · 10$^{-4}$ | 0.93 |
| #5 (25° C.) | 5.04 | 18.62 | 1.11 · 10$^{-6}$ | 5.98 · 10$^{-8}$ | 0.97 | 44.72 | 2.40 · 10$^{-2}$ | 5.38 · 10$^{-4}$ | 0.86 |

We studied the degradation behavior of five different perovskite-based solar cells. Large carrier trap densities were observed in the TSC curve of MAPbI$_3$-based PSCs aged under high operating temperatures. These carrier traps are detrimental to long-term stability. Perovskite alloys with mixed both cations and anions could effectively avoid the formation of phase-transition-induced carrier traps because of a lack of a similar intrinsic phase transition. By virtue of perovskite layer was prepared in a nitrogen-filled glove box (H$_2$O and O$_2$ concentrations <0.1 ppm) using a one-step method in the following way. A mixture of PbI$_2$ (98%; TCI) and CH$_3$NH$_3$I (1:1 by mol) for CH$_3$NH$_3$PbI$_3$ and mixtures with certain ratio of PbI$_2$, PbBr$_2$ (98%; TCI), CH$_3$NH$_3$I (TCI), HC(NH$_2$)$_2$I (TCI), and RbI ((Aldrich, 99.999% trace metals basis)) for perovskite alloys were dissolved in mixtures of γ-butyrolactone (GBL) and DMF (4:6 vol/vol; GBL, >99%; DMF, 99.8%; TCI) at 1.2 M and stirred at 60° C. for 12 h. The mixtures were then spin-coated on the PEDOT:PSS layer at 4000 rpm for 30 s. During spin coating, 0.3 mL of toluene was dropped onto the perovskite precursor layer. The precursor layer was baked on a hotplate at 60° C. for 15 min, followed by 100° C. for 30 min. The thickness of the perovskite layer was measured to be around 300 nm using a Dektak profilometer (DektakXT, Bruker). Finally, 30 nm $C_{60}$, 10 nm BCP, and 100 nm Au layers were thermally deposited on top of the $CH_3NH_3PbI_3$ layer under a high vacuum ($10^{-4}$ Pa) through a contact shadow mask. After unloading the PSCs directly into a glove box attached to the evaporation system, the PSCs were encapsulated using a glass lid and UV-cured sealant. Current density-voltage and external quantum efficiency measurements were performed on the PSCs using a computer-controlled Keithley 2400 source unit and an external quantum efficiency measurement system (WXS-155S-10: Wacom Denso) under simulated AM1.5G solar illumination from a Xe lamp-based solar simulator (SRO-25 GD, Bunkokeiki). The active area of the PSC was defined to be 16 $mm^2$ by the overlap of the patterned ITO and Au electrodes. The lamp power was carefully calibrated at 100 mW $cm^{-2}$ (1 sun) using a crystalline Si reference cell with an amorphous Si optical filter (Bunkokeiki), which was certificated by the National Institute of Advanced Industrial Science and Technology of Japan. The photovoltaic performance of our devices was not confirmed from independent certification laboratories.

For characterization of degraded perovskites, such as XRD and SEM, we use scotch tape to peel off the top metal electrode after carefully removing the encapsulation glass.

Device Lifetime Measurements. Stimulated solar light (AM1.5G) from WLEDs was continuously illuminated onto the PSCs at open-circuit conditions with the devices held at 25° C. or 85° C. by a temperature controller. Time-dependent $V_{OC}$, $J_{SC}$, FF, and η were measured automatically using a lifetime measurement system (System Engineers). For thermal cycling tests, the device temperature was changed by hand approximately every hundred hours.

TSC Measurement. The PSC was placed in a TSC measurement chamber (Rigaku TSC-FETT EL2000), and the ITO anode and Au cathode layers were connected to gold leads. The chamber was then evacuated using a rotary mechanical pump and filled with helium, which acted as a heat transfer medium. These evacuation and filling procedures were repeated three times to completely replace the atmosphere in the chamber with helium. The device was cooled to −183° C. (90 K) using liquid nitrogen. The PSC was biased at 1 mA $cm^{-2}$ for 2 min at liquid nitrogen temperatures to fill carrier traps with injected carriers from the electrodes. The device temperature was then increased up to 110° C. (383 K) at a heating rate of 5 K $min^{-1}$. The carriers released from the traps during the heating process were measured as current to draw the TSC curves. The background current curve was measured without trap filling at the liquid nitrogen temperature. The trap depth ($E_T$) can be calculated using equation 1.

$$E_T = k_B T_m \ln(T_m^4/\beta) \quad (1)$$

where $k_B$ is Bolzmann's constant ($8.617 \times 10^{-5}$ eV $K^{-1}$), $T_m$ is the temperature of the TSC peak, and β is the heating rate (5 K $min^{-1}$).

The trap density ($N_t$) is given by equation 2.

$$N_t = Q/qAL \quad (2)$$

where Q is the area under the TSC peak, which is equal to the number of charges (in this case, holes) emitted from the sample during the heating process, q is the electronic charge, A is the active device area, and L is the layer thickness.

Absorption Measurement. Ultraviolet-visible-near infrared absorption spectra of the perovskite films were measured using a Perkin-Elmer Lambda 950-PKA spectrophotometer in air with a relative humidity of 25%. An ITO-coated glass substrate was used as a reference.

X-ray Diffraction Measurement. The XRD characteristics were evaluated with an X-ray diffraction system using a 2 θ/θ technique [λ=1.54 Å (CuKα)] (Rigaku, RINT-2500). Diffraction peaks coming from ITO, PEDOT:PSS, and $C_{60}$ were undetectable.

Electroluminescence characterization. The J-V-L-EQE characteristics of the PSCs were measured using an absolute EQE measurement system (C9920-12, Hamamatsu Photonics) connected with a computer-controlled source meter (2400, Keithley) and multichannel analyzer (PMA-12, Hamamatsu Photonics). EL spectra were automatically recorded using the same system at each measurement point.

The invention claimed is:

1. A perovskite film having substantially-no phase transition within the temperature range of from 0° C. to 100° C. and comprising a perovskite compound represented by the following General Formula (2), $$M_r A^1_t A^2_{1-(r+t)} B X^1_m X^2_{3-m} \quad (2)$$

wherein M is $Rb^+$, $A^1$ is formamidinium, $A^2$ is methyl ammonium, B represents a divalent metal ion, one of $X^1$ and $X^2$ represents $I^-$ and the other of $X^1$ and $X^2$ represents $Br^-$, r represents a number of more than 0 and 0.1 or less, t represents a number of 0.1 or more and 0.7 or less, and m represents a number of 0 or more and less than 3.

2. The perovskite film according to claim 1, wherein both t and m are more than 0.

3. The perovskite film according to claim 1, wherein, $X^1$ is $Br^-$, $X^2$ is $I^-$, and m is 0.1 or more and 0.7 or less.

4. The perovskite film according to claim 1, wherein B is $Pb^{2+}$.

5. A light-emitting device comprising a light-emitting layer of a perovskite film having substantially-no phase transition within the temperature range of from 0° C. to 100° C. and comprising a perovskite compound represented by the following General Formula (2), $$M_r A^1_t A^2_{1-(r+t)} B X^1_m X^2_{3-m} \quad (2)$$

wherein M represents $Rb^+$, Cs or K, $A^1$ is formamidinium, $A^2$ is methyl ammonium, B represents a divalent metal ion, one of $X^1$ and $X^2$ represents $I^-$ and the other of $X^1$ and $X^2$ represents Br, r represents a number of 0 or more and 0.1 or less, t represents a number of 0.1 or more and 0.7 or less, and m represents a number of 0 or more and less than 3.

6. A solar cell comprising the perovskite film according to claim 1.

* * * * *